(12) United States Patent
Reichman et al.

(10) Patent No.: US 12,431,611 B2
(45) Date of Patent: *Sep. 30, 2025

(54) SEMICONDUCTOR DEVICES AND METHODS OF MANUFACTURING SEMICONDUCTOR DEVICES

(71) Applicant: Amkor Technology Singapore Holding Pte. Ltd., Valley Point (SG)

(72) Inventors: Corey Reichman, Mesa, AZ (US); Kyoung Yeon Lee, Incheon (KR); Se Man Oh, Incheon (KR); Byong Jin Kim, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/739,090

(22) Filed: Jun. 10, 2024

(65) Prior Publication Data

US 2024/0332781 A1 Oct. 3, 2024

Related U.S. Application Data

(62) Division of application No. 17/376,041, filed on Jul. 14, 2021, now Pat. No. 12,046,798.

(51) Int. Cl.
*H01Q 1/22* (2006.01)
*H01L 23/34* (2006.01)
(Continued)

(52) U.S. Cl.
CPC .......... *H01Q 1/2283* (2013.01); *H01L 23/34* (2013.01); *H01L 23/66* (2013.01); *H01Q 9/0414* (2013.01);
(Continued)

(58) Field of Classification Search
CPC .. H01Q 1/2283; H01Q 9/0407; H01Q 9/0414; H01Q 9/0421; H01Q 9/0428;
(Continued)

(56) References Cited

U.S. PATENT DOCUMENTS 6,713,322 B2 3/2004 Lee
6,975,029 B2 12/2005 Horie
(Continued)

OTHER PUBLICATIONS

Andy Heinig et al. "Contruction Kit of RF Blocks in Package Technologies" Presentation at the 53rd International Symposium on Microelectronics, IMAPS 2020, Oct. 5-8, 2020.

*Primary Examiner* — Robert Karacsony
(74) *Attorney, Agent, or Firm* — Kevin B. Jackson

(57) ABSTRACT

A semiconductor device includes a substrate including a conductive transceiver pattern proximate to the substrate top side. An antenna structure includes an antenna dielectric structure coupled to the substrate top side, an antenna conductive structure having an antenna element, and a cavity below the antenna element. The antenna element overlies the conductive transceiver pattern. The cavity includes a cavity ceiling, a cavity base, and a cavity sidewall. Either a bottom surface of the antenna element defines the cavity ceiling and a perimeter portion of the antenna element is fixed to the antenna dielectric structure, or the antenna dielectric structure includes a body portion having a bottom surface that defines the cavity ceiling and the antenna element is vertically spaced apart from the bottom surface of the body portion. A semiconductor component is coupled to the substrate bottom side and the transceiver pattern.

20 Claims, 19 Drawing Sheets

(51) Int. Cl.
   *H01L 23/66* (2006.01)
   *H01Q 9/04* (2006.01)
   *H01Q 9/16* (2006.01)
   *H01Q 23/00* (2006.01)

(52) U.S. Cl.
   CPC ............... *H01Q 9/16* (2013.01); *H01Q 23/00* (2013.01); *H01L 2223/6677* (2013.01)

(58) Field of Classification Search
   CPC ...... H01Q 9/0435; H01Q 9/0457; H01Q 9/16; H01Q 23/00; H01L 23/34; H01L 23/66; H01L 2223/6677
   See application file for complete search history.

(56) References Cited

U.S. PATENT DOCUMENTS

| | | |
|---|---|---|
| 7,518,221 B2 | 4/2009 | Gaucher et al. |
| 8,102,037 B2 | 1/2012 | Lee |
| 10,580,713 B2 | 3/2020 | Chen |
| 12,046,798 B2 * | 7/2024 | Reichman ............ H01Q 1/2283 |
| 2006/0276157 A1 | 12/2006 | Chen et al. |
| 2007/0164907 A1 | 7/2007 | Gaucher et al. |
| 2012/0105302 A1 | 5/2012 | Kato |
| 2020/0127366 A1 | 4/2020 | Liao |
| 2020/0388928 A1 | 12/2020 | Lin |
| 2021/0125945 A1 | 4/2021 | Chen |
| 2021/0273323 A1 * | 9/2021 | Bulumulla ............. H01Q 1/422 |

\* cited by examiner

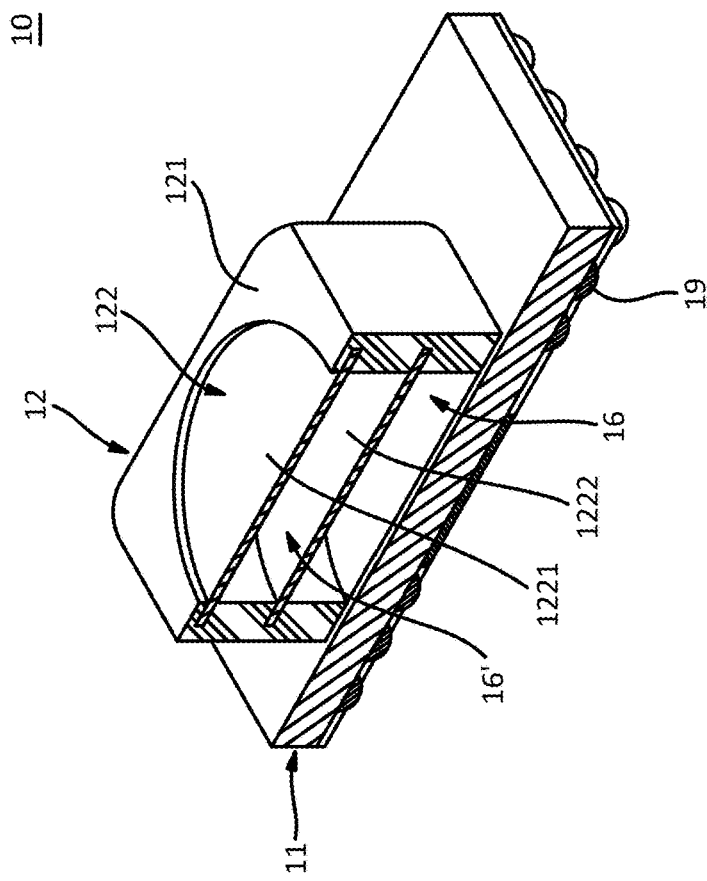
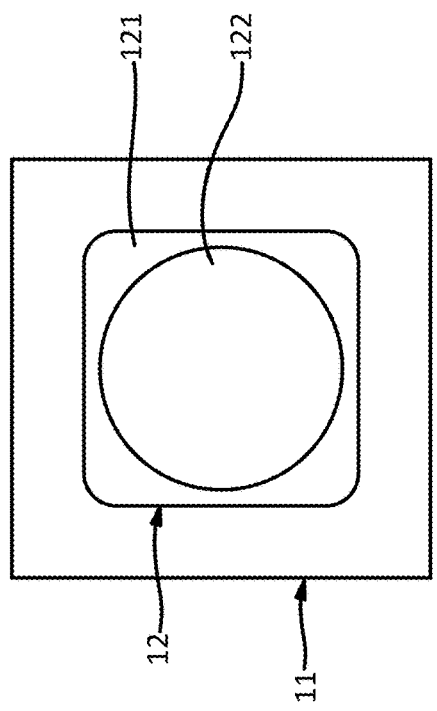
FIG.1B
FIG.1A

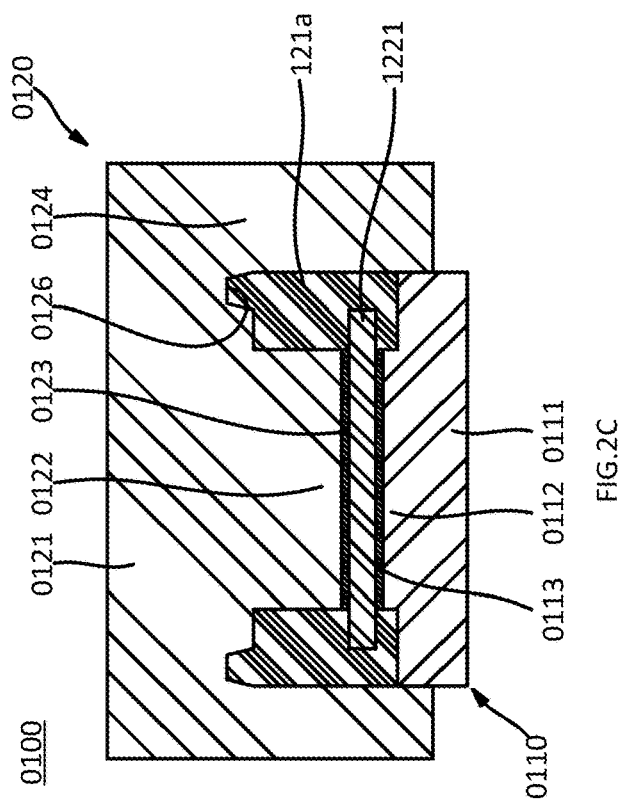
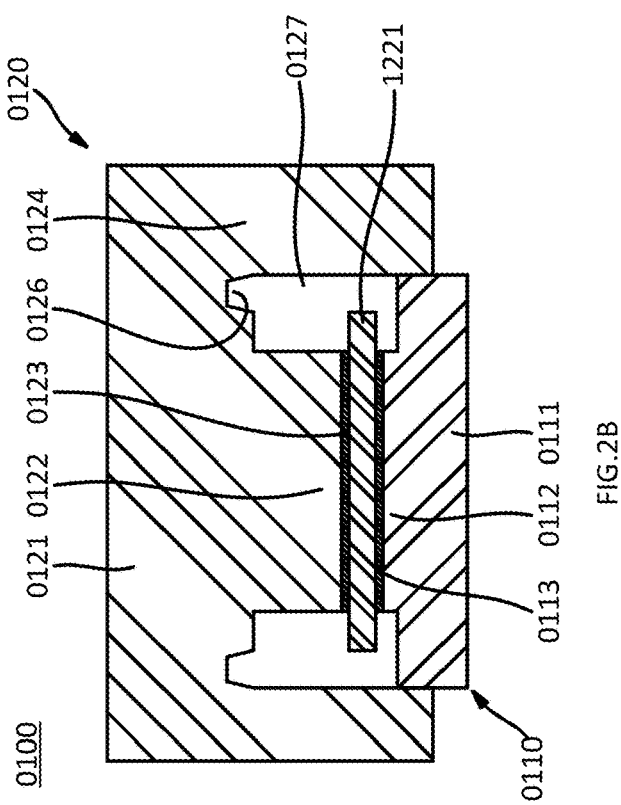

SEMICONDUCTOR DEVICES AND METHODS OF MANUFACTURING SEMICONDUCTOR DEVICES

CROSS-REFERENCE TO RELATED APPLICATIONS

This application is a divisional application of co-pending U.S. patent application Ser. No. 17/376,041 filed on Jul. 14, 2021 and issued as U.S. Pat. No. 12,046,798 on Jul. 23, 2024, which is incorporated by reference herein and priority thereto is hereby claimed.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 1A, 1B, and 1C show a top plane view, a perspective cross-sectional view, and a cross-sectional view of an example electronic device.

FIGS. 2A, 2B, 2C, 2D, 2E, 2F, 2G, 2H, 2I, 2J, and 2K show cross-sectional views of an example method for manufacturing an example electronic device.

Figure 1C:
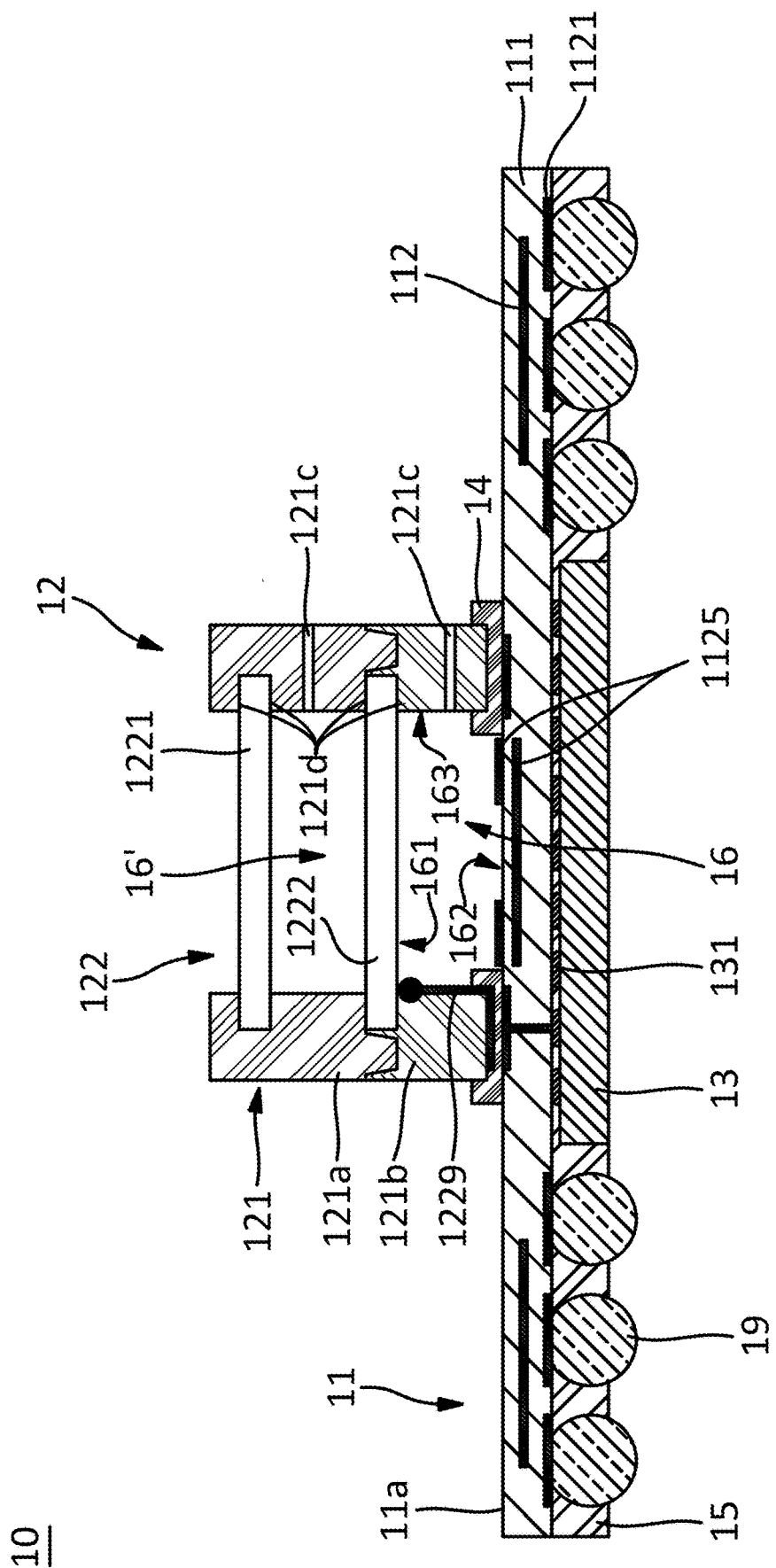

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In an example, an electronic device includes a substrate having a substrate top side, a substrate bottom side, a first dielectric structure, and a first conductive structure. The first conductive structure includes a transceiver pattern proximate to the substrate top side. An antenna structure includes a second dielectric structure coupled to the substrate top side, a second conductive structure having a first antenna element, and a first cavity below the first antenna element. The first antenna element overlies the transceiver pattern. The first cavity includes a first cavity ceiling, a first cavity base, and a first cavity sidewall between the first cavity ceiling and the first cavity base. Either a bottom surface of the first antenna element defines the first cavity ceiling and a perimeter portion of the first antenna element is fixed to the second dielectric structure, or the second dielectric structure includes a body portion having a bottom surface that defines the first cavity ceiling and the first antenna element is vertically spaced apart from the bottom surface of the body portion. An electronic component is coupled to the bottom side of the substrate and is coupled to the transceiver pattern.

In an example, an electronic device includes a substrate having a substrate top side, a substrate bottom side, a first dielectric structure, and a first conductive structure. The first conductive structure includes a transceiver pattern proximate to the substrate top side. An antenna structure is coupled to the substrate top side and includes a second dielectric structure, a second conductive structure that includes a first antenna element; and a second antenna element overlapping the first antenna element, and a cavity. At least a portion of the first antenna element is embedded within the second dielectric structure. The first antenna element and second antenna element overlie the transceiver pattern. The cavity comprises a cavity ceiling, a cavity base, and a cavity sidewall between the cavity ceiling and the cavity base. An electronic component is coupled to the bottom side of the substrate and is coupled to the transceiver pattern.

In an example, a method of forming an electronic device includes providing a substrate having a substrate top side, a substrate bottom side, a first dielectric structure, and a first conductive structure, which includes a transceiver pattern proximate to the substrate top side. The method includes providing an antenna structure having a second dielectric structure coupled to the substrate top side, a second conductive structure comprising an antenna element; and a cavity below first antenna element. At least a portion of the first antenna element is exposed outside of the electronic device, the first antenna element overlies the transceiver pattern; and the cavity includes a cavity ceiling, a cavity base, and a cavity sidewall between the cavity ceiling and the cavity base. The method includes providing an electronic component coupled to the bottom side of the substrate and coupled to the transceiver pattern.

Other examples are included in the present disclosure. Such examples may be found in the figures, in the claims, and/or in the description of the present disclosure.

FIGS. 1A, 1B, and 1C show a top plane view, a perspective cross-sectional view, and a cross-sectional view of an example electronic device 10. In the example shown in FIGS. 1A, 1B, and 1C, electronic device 10 can comprise substrate 11, antenna structure 12, electronic component 13, bond 14, encapsulant 15 (optional), cavities 16 and 16', and external interconnects 19.

Substrate 11 can comprise base 11a, dielectric structure 111 and conductive structure 112. Conductive structure 112 can comprise substrate terminals 1121 and transceiver pattern 1125. Antenna structure 12 can comprise dielectric structure 121 and conductive structure 122. Dielectric structure 121 can comprise body 121a, foot 121b, vent 121c, and ledge 121d. Conductive structure 122 can comprise antenna elements 1221,1222 or conductor 1229. Electronic component 13 can comprise component interconnects 131. Cavity 16 can comprise cavity ceiling 161, cavity base 162, and cavity sidewall 163.

Substrate 11, antenna structure 12, bond 14, encapsulant 15, cavities 16 and 16', and external interconnects 19 can be referred to as a semiconductor package, and the package can provide protection for electronic component 13 from exposure to external elements and/or the environment. The semiconductor package can provide electrical coupling between external electrical components and external interconnects 19.

FIGS. 2A, 2B, 2C, 2D, 2E, 2F, 2G, 2H, 2I, 2J, and 2K show cross-sectional views of an example method for manufacturing electronic device 10.

Figure 2A:
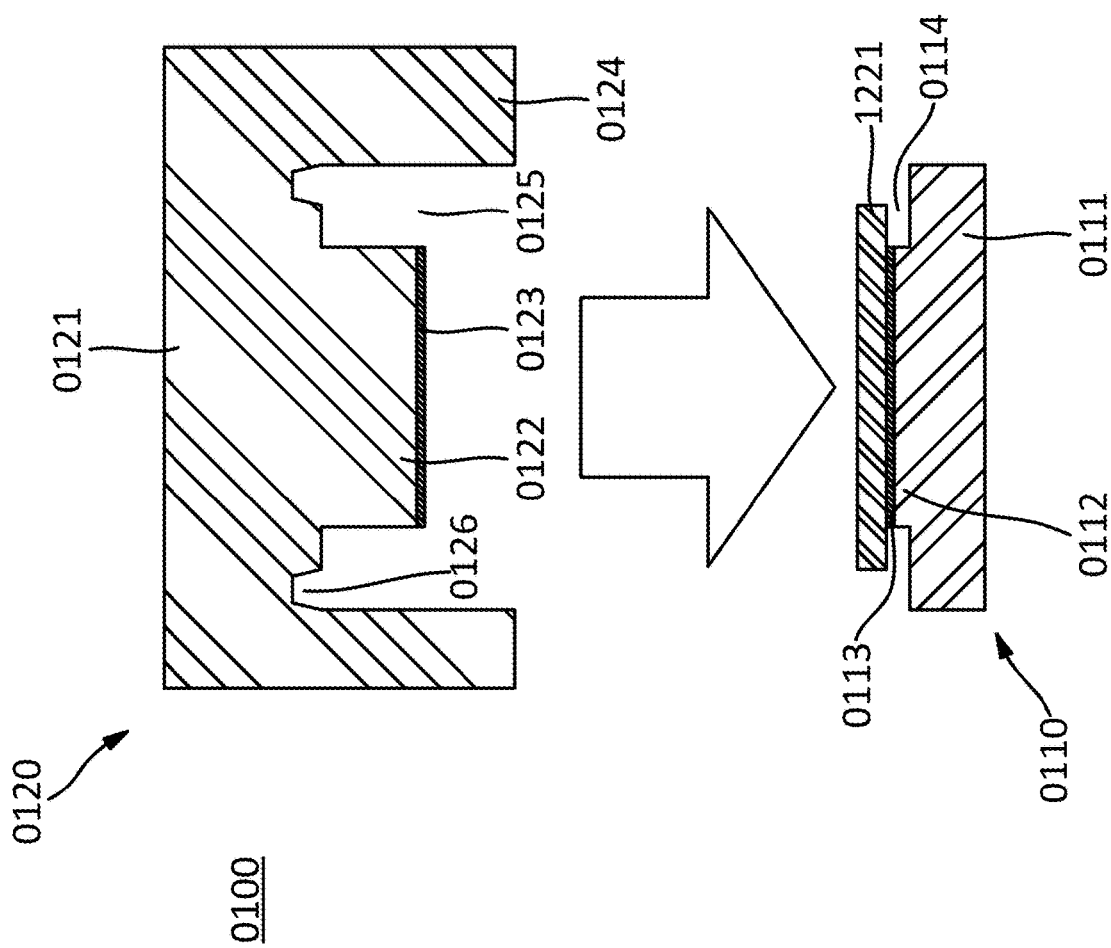

FIG. 2A shows a cross-sectional side view and top view of electronic device 10 at an early stage of manufacture. In the example shown in FIG. 2A, antenna element 1221 for antenna structure 12 can be provided. Antenna element 1221 can comprise or be referred to as a transmitter, antenna, or lid. In some examples, antenna element 1221 can be provided in the form of an approximately circular plate or a polygonal plate, such as rectangular or square. Antenna element 1221 can comprise copper, brass, aluminum, palladium, gold, silver, chromium, nickel, or an alloy. Antenna element 1221 can be provided by punching, stamping, or etching a metal plate. Antenna element 1221 can comprise a side finish layer provided to prevent oxidation growth. In some examples, the side finish layer can be provided by plating non-oxidizing nickel or gold on antenna element 1221. In some examples, wire bonding can also be performed on or through the side finish layer. The thickness of antenna element 1221 can range from approximately 0.01 mm (millimeter) to approximately 3 mm, and the area can range from approximately 0.05 mm×0.05 mm to approximately 30 mm×30 mm. Antenna element 1221 can receive or transmit a radio frequency (RF) signal from or to transceiver pattern 1125.

In some examples, antenna element 1221 can be disposed between lower plate 0110 and upper plate 0120 of forming tool 0100. In some examples, forming tool 0100 can comprise or be referred to as a molding tool or molding chase. In some examples, lower plate 0110 can comprise low base 0111, low protrusion 0112 protruding from low base 0111, and low seal 0113 disposed on a side of low protrusion 0112. In some examples, low step 0114 can be provided around the low protrusion 0112. In some examples, upper plate 0120 can comprise upper base 0121, upper protrusion 0122 protruding from upper base 0121, upper seal 0123 disposed on the side of upper protrusion 0122, and upper flange 0124 protruding from upper base 0121 and disposed on the outside of upper protrusion 0122. In some examples, an upper cavity 0125 can be defined between upper protrusion 0122 and upper flange 0124. In some examples, the length of upper flange 0124 can be greater than that of upper protrusion 0122. Antenna element 1221 can be disposed on low protrusion 0112 of lower plate 0110, for example, on low seal 0113. In some examples, the horizontal width of antenna element 1221 can be larger than that of the low protrusion 0112. In some examples, low seal 0113 and upper seal 0123 can comprise or be referred to as a silicone seal. The silicone seal can prevent resin from flowing across the inner area of antenna element 1221. In some examples, an upper alignment groove 0126 can be provided at the upper end of upper cavity 0125 to align the position of antenna element 1221.

FIG. 2B shows a cross-sectional view of electronic device 10 at a later stage of manufacture. In the example shown in FIG. 2B, antenna element 1221 for antenna structure 12 can be fixed between lower plate 0110 and upper plate 0120. In some examples, lower protrusion 0112 and lower seal 0113 can contact the lower side of antenna element 1221, and upper protrusion 0122 and upper seal 0123 can contact the upper side of antenna element 1221. In some examples, a perimeter portion of antenna element 1221 can protrude from low seal 0113 and upper seal 0123. In some examples, upper flange 0124 can contact the lateral side of low base 0111. An integrated cavity 0127 sealed between lower plate 0110 and upper plate 0120 (provided, for example, by upper cavity 0125 and low step 0114) can be defined, and a perimeter portion of antenna element 1221 can protrude into integrated cavity 0127.

FIG. 2C shows a cross-sectional view of electronic device 10 at a later stage of manufacture. In the example shown in FIG. 2C, resin can flow into integrated cavity 0127 provided between lower plate 0110 and upper plate 0120. The resin can be cooled and solidified to define body 121a of dielectric structure 121 for antenna structure 12 along the perimeter portion of antenna element 1221. The perimeter portion of antenna element 1221 can be coupled to body 121a of dielectric structure 121. In some examples, body 121a of dielectric structure 121 can be provided with an epoxy mold compound, a polymer, or a liquid crystal polymer (LCP). In some examples, the surfaces of body 121a dielectric structure 121 that are coupled to the perimeter of antenna element 1221 can comprise or be referred to as ledges.

Figure 2E:
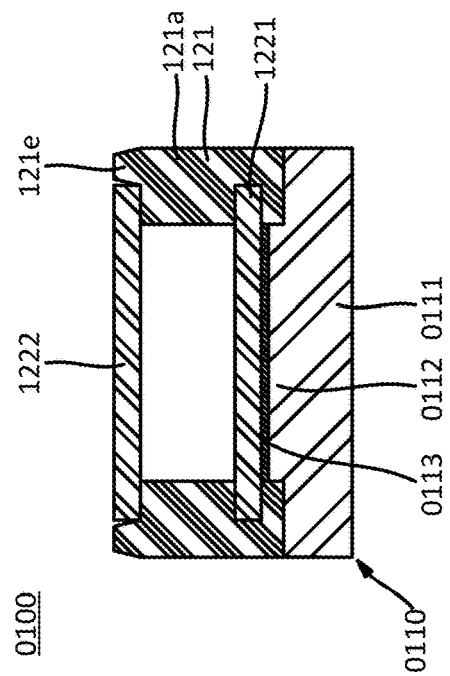
Figure 2D:
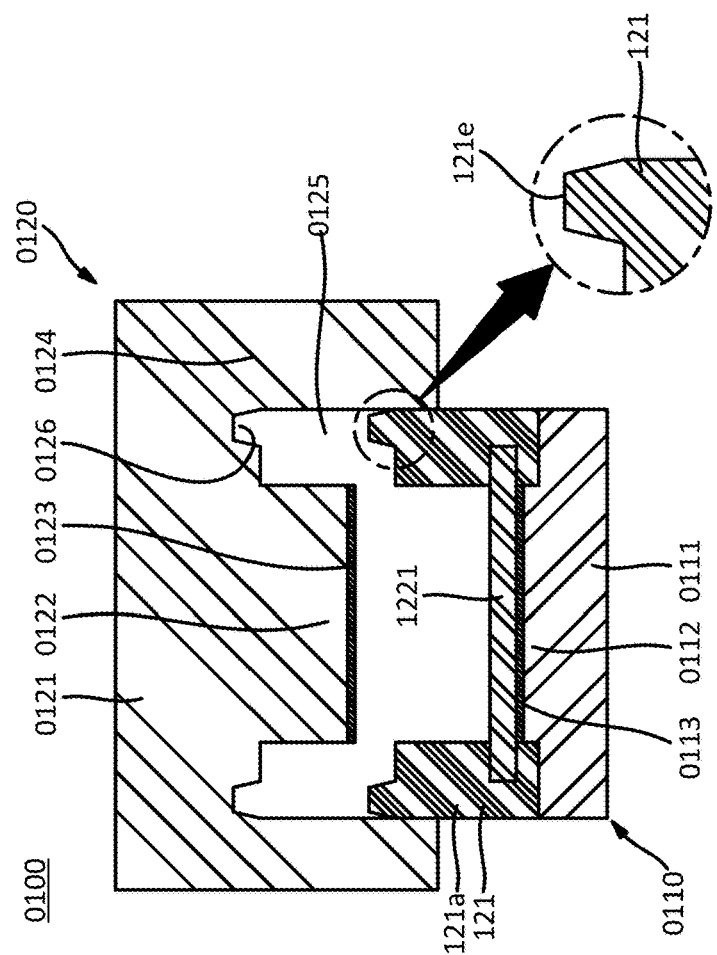

FIG. 2D shows a cross-sectional view of electronic device 10 at a later stage of manufacture. In the example shown in FIG. 2D, upper plate 0120 can be separated from lower plate 0110 to define body 121a of dielectric structure 121. In some examples, body 121a of dielectric structure 121 can be provided with alignment protrusion 121e corresponding to upper alignment groove 0126.

FIG. 2E shows a cross-sectional view of electronic device 10 at a later stage of manufacture. In the example shown in FIG. 2E, antenna element 1222 for antenna structure 12 can be provided on body 121a of dielectric structure 121. In some examples, antenna element 1222 can be similar to antenna element 1221.

Antenna element 1222 can be positioned on a recessed area or ledge inward of alignment protrusion 121e. In some examples, the lateral side of alignment protrusion 121e can be sloped to slide or guide antenna element 1222 down to a precise desired area on body 121a of dielectric structure 121. In some examples, the thickness of alignment protrusion 121e can be similar to the thickness of antenna element 1222.

Figure 2G:
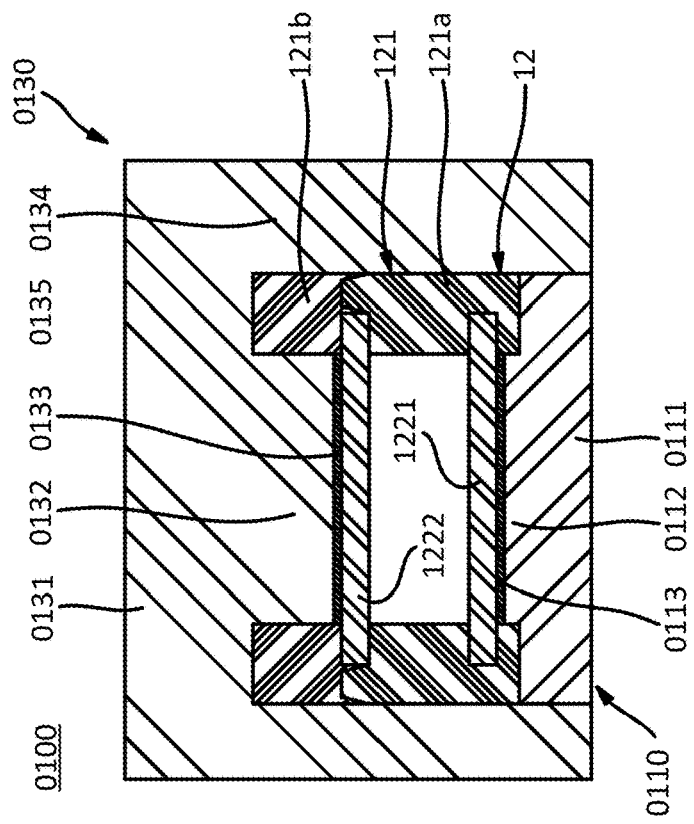
Figure 2F:
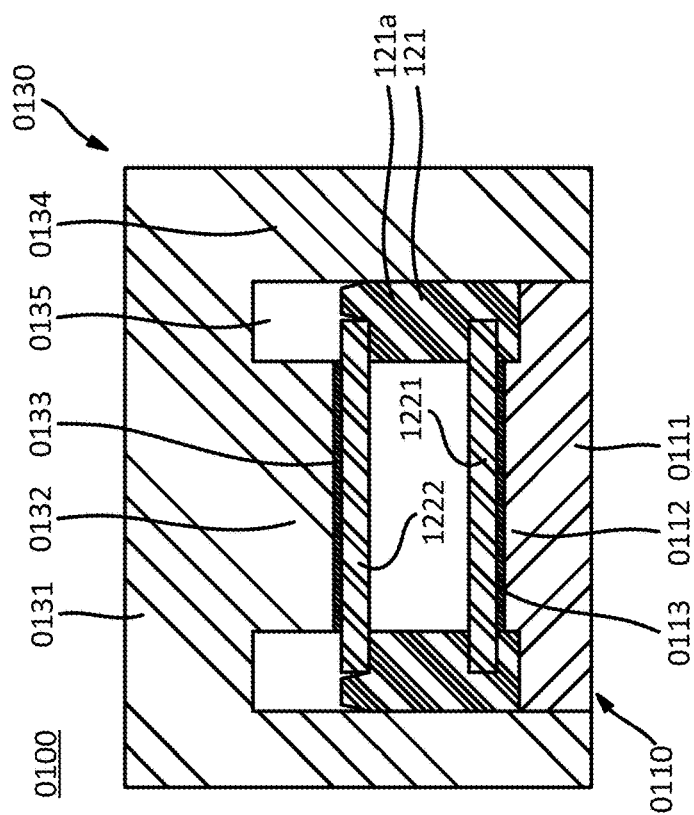

FIG. 2F shows a cross-sectional view of electronic device 10 at a later stage of manufacture. In the example shown in FIG. 2F, upper mold plate 0130 can be positioned with respect to lower plate 0110 and antenna structure 12. In some examples, upper mold plate 0130 can comprise upper base 0131, upper protrusion 0132 protruding from upper base 0131, upper seal 0133 disposed on the side of upper protrusion 0132, and upper flange 0134 protruding from upper base 0131 and disposed on the outside of upper protrusion 0132. In some examples, upper cavity 0135 can be defined between upper protrusion 0132 and upper flange 0134. In some examples, the length of the upper flange 0134 can be greater than that of upper protrusion 0132. Antenna element 1222 can be disposed under upper protrusion 0132 of upper mold plate 0130, for example, in contact with upper seal 0133. In some examples, the horizontal width of antenna element 1222 can be larger than that of upper protrusion 0132. In some examples, upper flange 0134 of upper mold plate 0130 can extend to cover or contact body 121a of dielectric structure 121 or lower plate 0110. In some examples, sealed upper cavity 0135 can be provided between body 121a of dielectric structure 121 and upper plate 0120, and a perimeter portion of antenna element 1222 can protrude into upper cavity 0135.

FIG. 2G shows a cross-sectional view of electronic device 10 at a later stage of manufacture. In the example shown in FIG. 2G, resin can flow into upper cavity 0135 provided between body 121a of dielectric structure 121 and upper plate 0120. The resin can be cooled and solidified to define foot 121b of dielectric structure 121 for antenna structure 12 along the perimeter portion of antenna element 1222. The perimeter portion of antenna element 1222 can be coupled to foot 121b of dielectric structure 121. In some examples, foot 121b of dielectric structure 121 can be provided with an epoxy mold compound, a polymer, or a liquid crystal polymer (LCP). In some examples, the surfaces of foot 121b of dielectric structure 121 coupled to the perimeter of antenna element 1222 can comprise or be referred to as ledges.

Figure 2I:
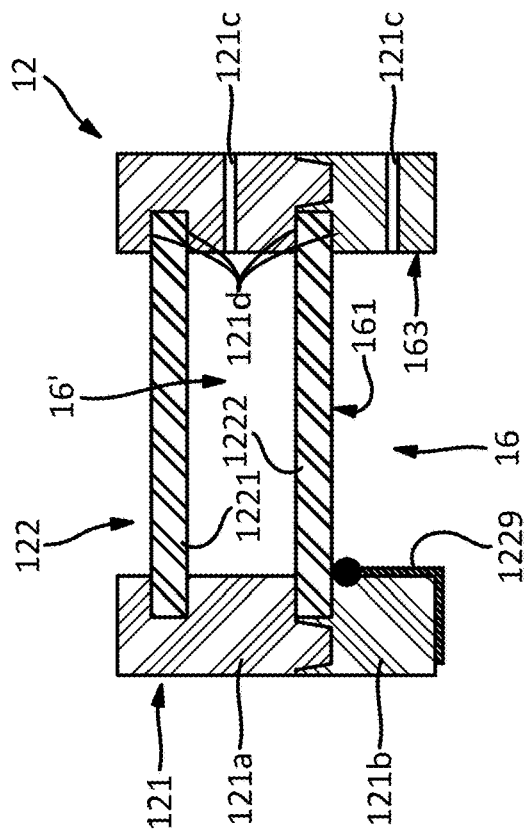
Figure 2H:
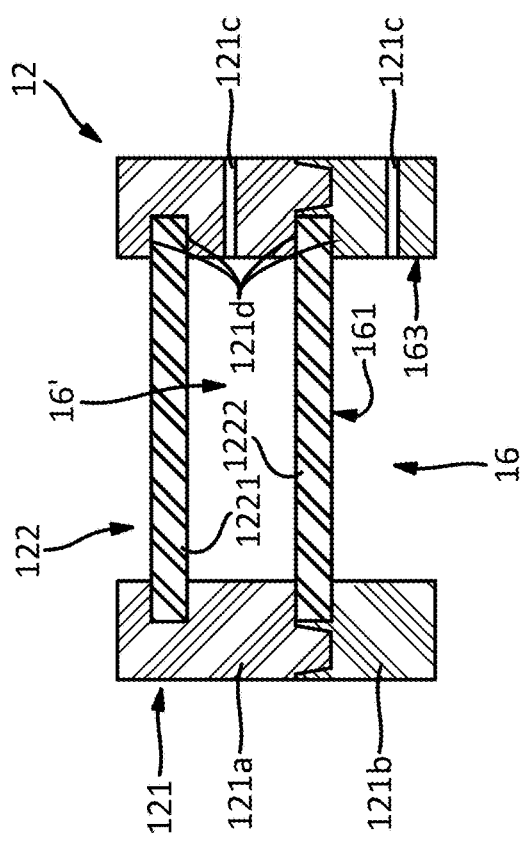

FIG. 2H shows a cross-sectional view of electronic device 10 at a later stage of manufacture. In the example shown in FIG. 2H, antenna structure 12 can be provided released from tool 0100. In some examples, antenna structure 12 can be separated from lower plate 0110 and upper plate 0120 and then flipped. In some examples, the horizontal area of antenna structure 12 can range from about 0.05 mm×0.05 mm to about 30 mm×30 mm, or the vertical thickness can range from about 0.01 mm to 2 mm.

Antenna structure 12 can comprise dielectric structure 121 and conductive structure 122. Dielectric structure 121 can comprise body 121a and foot 121b and can also comprise ledges 121d coupled to or supporting conductive structure 122. Conductive structure 122 can comprise upper antenna element 1221 and lower antenna element 1222. Lower cavity 16 can be defined under lower antenna element 1222, and upper cavity 16' can be defined between lower antenna element 1222 and upper antenna element 1221. In some examples, cavity 16 can be defined by cavity ceiling 161 and cavity sidewall 163.

In some examples, vent 121c can be provided in dielectric structure 121. Vent 121c can be provided in an area corresponding to lower cavity 16 or an area corresponding to upper cavity 16', respectively. In some examples, vent 121c can be provided by a mechanical drill or a laser drill. The diameter of vent 121c can range from about 0.1 mm to about 2 mm. Vent 121c can allow outgassing during subsequent processing, testing, or field use. In some examples, vent 121c can be defined during molding by tool 0100 instead of by drill.

FIG. 2I shows a cross-sectional view of electronic device 10 at a later stage of manufacture. In the example shown in FIG. 2I, conductor 1229 can be provided. In some examples, conductor 1229 can comprise a trace or a pad. Conductor 1229 can have one end coupled to antenna element 1222 and the other end extending to the bottom side of dielectric structure 121. In some examples, conductor 1229 can be provided by plating, printing, sputtering, spraying, or laser directed structuring (LDS). In some examples, conductor 1229 can comprise copper, brass, aluminum, nickel, palladium, gold, silver, chromium, or an alloy. In some examples, the length of the trace can be approximately 1 mm to 10 mm, the width can range from approximately 0.1 mm to 1 mm. In some examples, a reinforcement joint, such as solder, solder paste, or conductive epoxy, can be used to couple or secure the coupling between conductor 1229 and antenna element 1222.

Figure 2J:
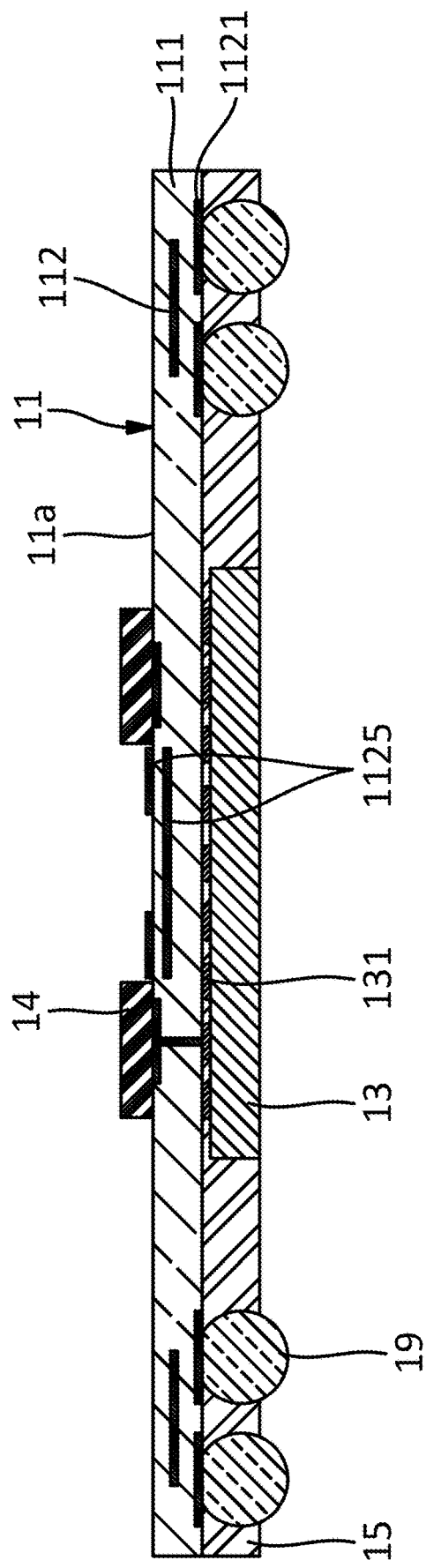

FIG. 2J shows a cross-sectional view of electronic device 10 at another stage of manufacture. In the example shown in FIG. 2J, bond 14 can be provided on the substrate 11. In some examples, bond 14 can comprise or be referred to as an adhesive, solder, paste or film. In some examples, adhesives can comprise or be referred to as polymeric, metallic, conductive or dielectric adhesives. In some examples, the width of bond 14 can range from about 90% to about 130% of the width of foot 121b. In some examples, the thickness of bond 14 can be in the range of approximately 300 μm to 900 μm. In some examples, bond 14 can be provided on substrate 11 by dispensing, printing or spraying.

The area of substrate 11 can be application-dependent, but can range from about 3 mm×3 mm to about 30 mm×30 mm, and the thickness can range from about 0.1 mm to 2 mm. In some examples, substrate 11 can comprise base 11a, dielectric structure 111, and conductive structure 112. Dielectric structure 111 can comprise or be referred to as one or more dielectric layers. In some examples, the thickness of dielectric structure 111 can range from about 0.1 mm to about 2 mm. Conductive structure 112 can be interleaved with dielectric structure 111. Conductive structure 112 can comprise or be referred to as conductive traces, vias, pads, paths, or patterns. Conductive structure 112 can be one or more conductive layers interleaved with dielectric structure 111. Conductive structure 112 can comprise substrate terminals 1121 provided at a bottom side of dielectric structure 111, and transceiver pattern 1125 provided on one or more layers of dielectric structure 111. In some examples, substrate terminals 1121 can comprise or be referred to as pads. Transceiver pattern 1125 can comprise or be referred to as a wireless emitter, receiver, or transceiver pattern. In some examples, transceiver pattern 1125 can be provided in an area corresponding to or aligned with antenna structure 12. The thickness of conductive structure 112 can range from about 0.1 mm to about 2 mm.

In some examples, bond 14 can be provided on conductive structure 112 or dielectric structure 111 provided on substrate 11. In some examples, bond 14 can electrically couple conductor 1229 of antenna structure 12 to conductive structure 112 of substrate 11. In some examples, bond 14 can couple dielectric structure 121 of antenna structure 12 to base 11a of substrate 11 or dielectric structure 111.

In some examples, substrate 11 can be a redistribution layer ("RDL") substrate. RDL substrates can comprise one or more conductive redistribution layers and one or more dielectric layers where (a) can be formed layer by layer over an electronic device to which the RDL substrate is to be electrically coupled, or (b) can be formed layer by layer over a carrier where it can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process where it can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, where it could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitridization process instead using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In other examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers where it can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier where it is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In some examples, electronic component 13 can be coupled to the bottom side of substrate 11 through component interconnects 131. In some examples, electronic component 13 can comprise or be referred to as a chip, die, semiconductor device, electronic device, or packaged device. In some examples, electronic component 13 can comprise an RF circuit, a wireless baseband system on a chip (SoC) processor, a digital signal processor (DSPs), a network processor, a power management unit, an audio processor, a sensor, or an application-specific integrated circuit. In some examples, electronic component 13 can comprise a passive component, an integrated passive device, a capacitor, an inductor, or a diode. In some examples, the thickness of electronic component 13 can range from approximately 0.05 mm to approximately 1 mm. In some examples, component interconnects 131 can comprise or be referred to as pads, bumps, or pillars. In some examples, component interconnects 131 can comprise a metal such as copper (Cu), aluminum (Al), gold (Au), silver (Ag), nickel (Ni), palladium (Pd), and/or tin (Sn). In some examples, the width and/or thickness of component interconnects 131 can be approximately 0.01 mm to approximately 0.3 mm. In some examples, electronic component 13 can represent one or more electronic components individually coupled to substrate 11.

In some examples, external interconnects 19 can be coupled to substrate terminals 1121 at the bottom side of substrate 11. In some examples, external interconnect 19 can comprise or be referred to as a conductive ball, a conductive bump, a conductive pillar, or a solder ball. In some examples, a flux can be provided on substrate terminal 1121, a solder ball can be dropped on the flux, and then the solder ball can be coupled to substrate terminal 1121 through a reflow process or a laser assist bonding process. In some examples, external interconnect 19 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, the thickness or width of external interconnect 19 can be approximately 0.1 mm to approximately 10 mm.

In some examples, encapsulant 15 can surround electronic component 13 or external interconnects 19. In some examples, encapsulant 15 can comprise or be referred to as a mold compound, resin, sealant, filler-reinforced polymer, or organic body. In some examples, encapsulant 15 can comprise an epoxy resin or a phenol resin, a carbon black, or a silica filler. In some examples, encapsulant 15 can cover the bottom side of substrate 11 and cover the lateral sides of electronic component 13 or external interconnects 19. In some examples, the bottom side of electronic component 13 can be exposed from the bottom side of encapsulant 15. External component 19 can protrude from the bottom side of encapsulant 15. In some examples, encapsulant 15 can be provided by compression molding, transfer molding, liquid encapsulant molding, vacuum lamination, paste printing, or film assist molding. In some examples, compression molding can include a method of curing the flowable resin by putting substrate 11 (including electronic component 13 and external component 19) where a flowable resin is supplied into a mold in advance, and transfer molding can include a method of supplying and curing a fluid resin from a gate (supply port) of a mold to the periphery of substrate 11. In some examples, the thickness of encapsulant 15 can be approximately 0.1 mm to approximately 10 mm. Encapsulant 15 can protect electronic component 13 and external components 19 from exposure to external elements or environments and can provide structural integrity to electronic device 10.

Figure 2K:
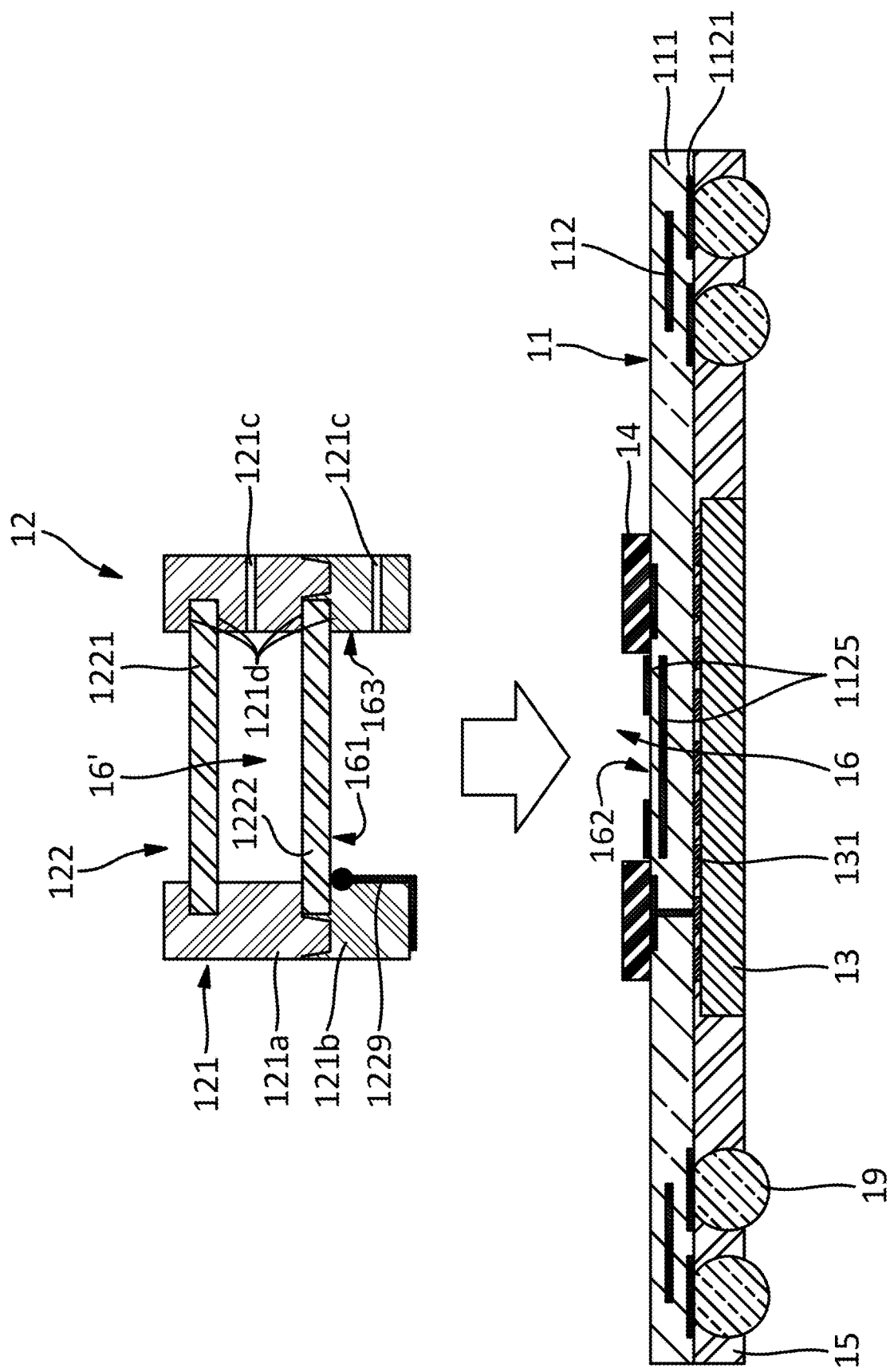

FIG. 2K shows a cross-sectional view of electronic device 10 at a later stage of manufacture. In the example shown in FIG. 2K, antenna structure 12 can be provided on substrate 11, to arrive at the configuration shown in FIG. 1C. In some examples, foot 121b of antenna structure 12 can be adhered to bond 14. In some examples, bond 14 can be provided at the lower end of foot 121b instead of being provided on substrate 11. In some examples, conductor 1229 of antenna structure 12 can be electrically coupled to conductive structure 112 or transceiver pattern 1125 of substrate 11. In some examples, dielectric structure 121 of antenna structure 12 can be coupled to base 11a or dielectric structure 121 of substrate 11. In some examples, after antenna structure 12 is provided on bond 14, a thermocompression process can be performed so where bond 14 can be cured. In some examples, after antenna structure 12 is provided on bond 14, a reflow process can be performed so the bond 14 can be cured.

In some examples, cavity 16 can be defined between substrate 11 and antenna structure 12. In some examples, cavity 16 can be defined by cavity ceiling 161 comprising the bottom side of antenna element 1222, cavity base 162 that comprises portion of base 11a or of the top side of substrate 11, and cavity sidewall 163 comprising an inner side of dielectric structure 121.

In some examples, the electronic component 13, external interconnects 19 and/or encapsulant 15 can be provided in subsequent processes where antenna structure 12 is provided on bond 14.

Electronic device 10 according to the present disclosure can provide optimal antenna performance at the lowest cost. As an example, antenna structure 12 according to the present disclosure can be a more efficient alternative to a multilayer laminate structure stack requiring low dF/dK core material that would increase the cost of the traditional substrate. In general, laminate material properties cannot be so attractive as air, laminate stacks are expensive, and form factor variations cannot be as robust as antenna structure 12 according to the present disclosure. In some examples, antenna structure 12 can function as a patch antenna using punched, stamped, etched or plated metal, and can be supported by a dielectric material, so that an air cavity capable of improving antenna performance between substrate 11 and antenna structure 12 can be created.

In general, air can have two beneficial dielectric properties to help maximize antenna radiation efficiency. First, with low loss (Df), the air can facilitate low attenuation at a given distance. Second, with a low dielectric constant (Dk), the air can provide a better-quality signal. Accordingly, the antenna structure according to the present disclosure can improve antenna characteristics by including an air gap. In some examples, the air cavity defined by an antenna element and a dielectric can be filled with atmospheric gases (nitrogen and oxygen), or special use gases used with hermetic seals such as helium or neon, where the dielectric structure 121 will not be vented.

Although the antenna structure has been described as including two antenna elements, it can comprise one antenna element or more than two antenna elements. Although the shape of the antenna element has been described as a circular plate or a polygonal plate, the antenna element can have a donut, microstrip, or parabolic shape. The antenna type can comprise a patch, dipole, loop, or monopole. The antenna element can be electrically coupled to a substrate but can also electrically float with respect to the substrate (not electrically coupled to the substrate). Although the dielectric of the antenna structure has been described as having an enclosed box-like shape with four or more walls, the dielectric of the antenna structure can also have a circular, rectangular, hexagonal, or open shape with a singular wall.

Figure 3:
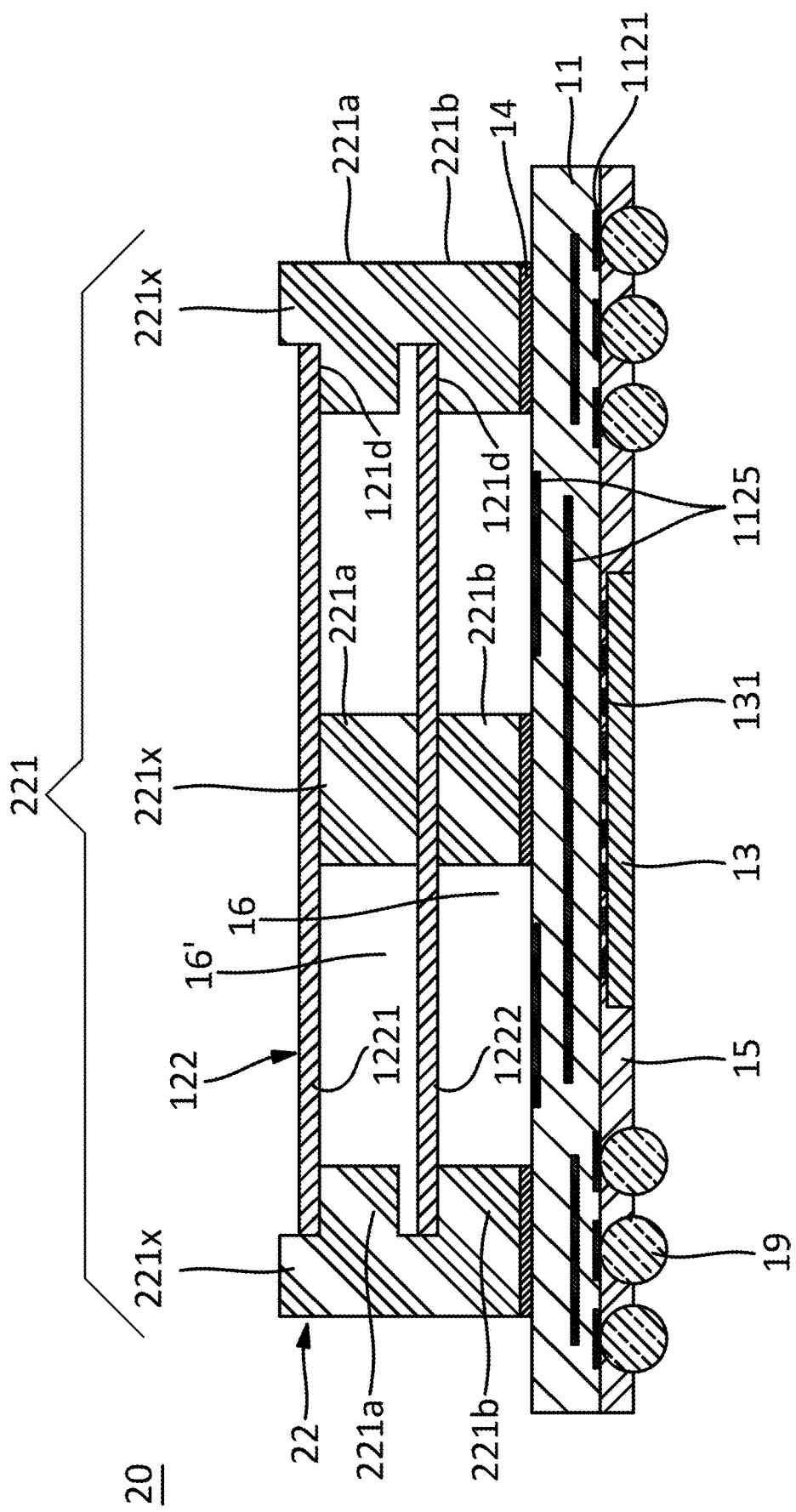
FIG. 3 shows a cross-sectional view of an example electronic device.

FIG. 3 shows a cross-sectional view of an example electronic device 20. In the example shown in FIG. 3, electronic device 20 can be similar to electronic device 10 described above and comprises antenna structure 22. Features, elements, or aspects of antenna structure 22 can be similar to those described with respect to antenna structure 12 or other antenna structures described herein. Antenna structure 22 can comprise dielectric structure 221 and conductive structure 122. Dielectric structure 221 can be similar to dielectric structure 121 and comprises dielectric segments 221x. Gaps between dielectric segments 221x can be larger than the diameter of vents 121c described above. Dielectric structure 221 can comprise dielectric segments 221x fixed through bond 14 to substrate 11. Dielectric segments 221x can comprise or be referred to as columns, walls, or sections. Each dielectric segment 221x can comprise body 221a, foot 221b, and one or more ledge 121d. The perimeters of antenna elements 1221 and 1222 can be coupled to or supported by respective ledges 121d of dielectric segments 221x. In some examples, ledges 121d can comprise or be referred to as a support or cover perimeter.

Figure 4:
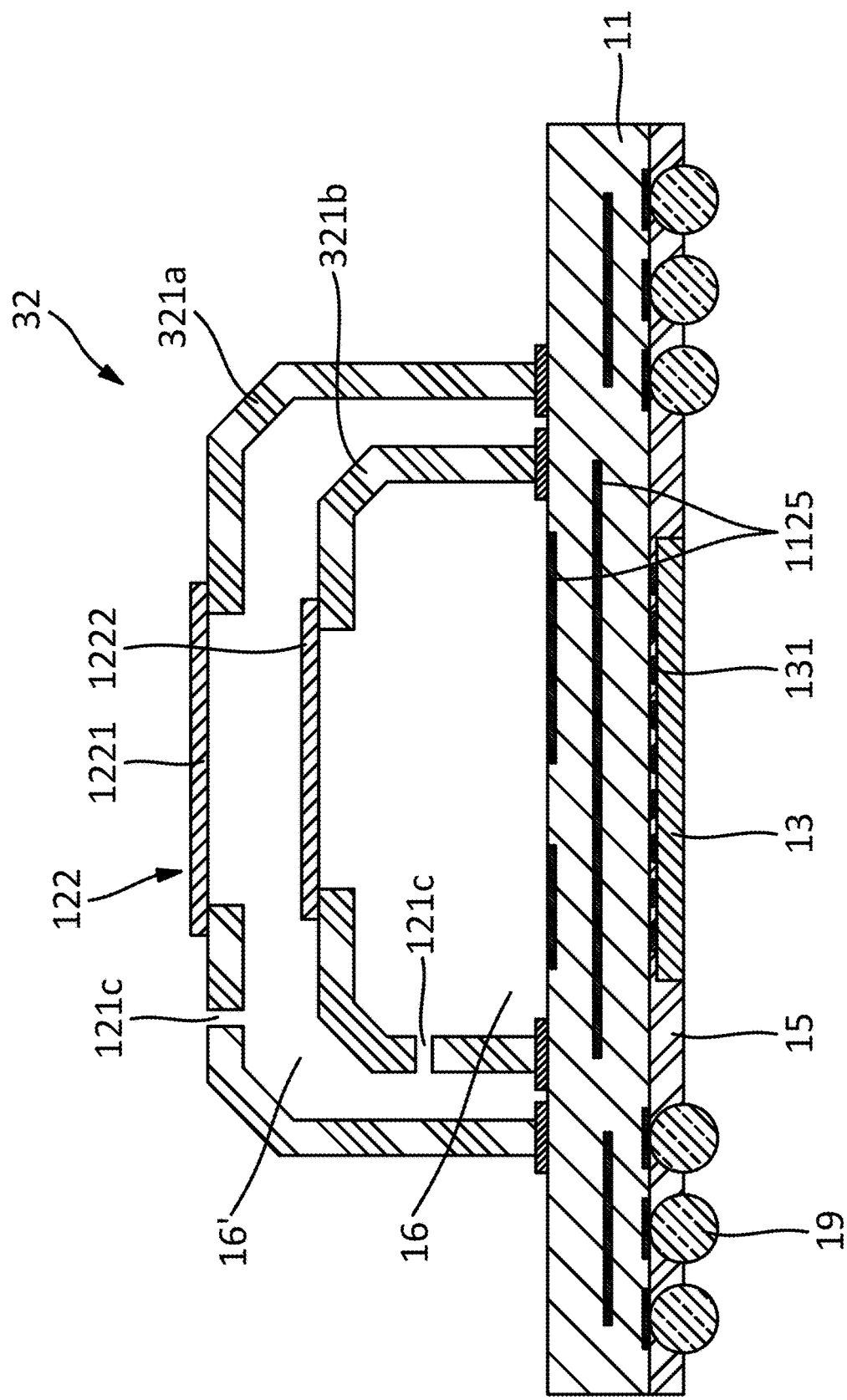
FIG. 4 shows a cross-sectional view of an example electronic device.

FIG. 4 shows a cross-sectional view of an example electronic device 30. Electronic device 30 can be similar to electronic device 10 described above and comprises antenna structure 32. Features, elements, or aspects of antenna structure 32 can be similar to those described with respect to antenna structure 12 or other antenna structures described herein. In some examples, antenna structure 32 can comprise dielectric structures 321a and 321b and antenna elements 1221 and 1222. In some examples, dielectric structure 321b can be fixed on substrate 11 through bond 14. In some examples, dielectric structure 321a can be spaced outside dielectric structure 321b and fixed on substrate 11 through bond 14. Air cavity 16 can be defined between antenna element 1222 and substrate 11, and air cavity 16' can be defined between antenna element 1221 and antenna element 1222.

In some examples, each of dielectric structures 321a and 321b can comprise a foot and a ceiling where it is bent inward from an upper end of the foot. In some examples, each of dielectric structures 321a and 321b can comprise vent 121c at one or more locations. In some examples, the perimeter of antenna element 1222 can be supported by dielectric structure 321b, and the perimeter of antenna element 1221 can be supported by dielectric structure 321a. Antenna element 1222 can overlap an opening through the ceiling of dielectric structure 321b, and antenna element 1221 can overlap an opening through the ceiling of dielectric structure 321a. Air cavity 16 can be defined between antenna element 1222 and substrate 11, and air cavity 16' can be defined between antenna element 1221 and antenna element 1222.

Figure 5:
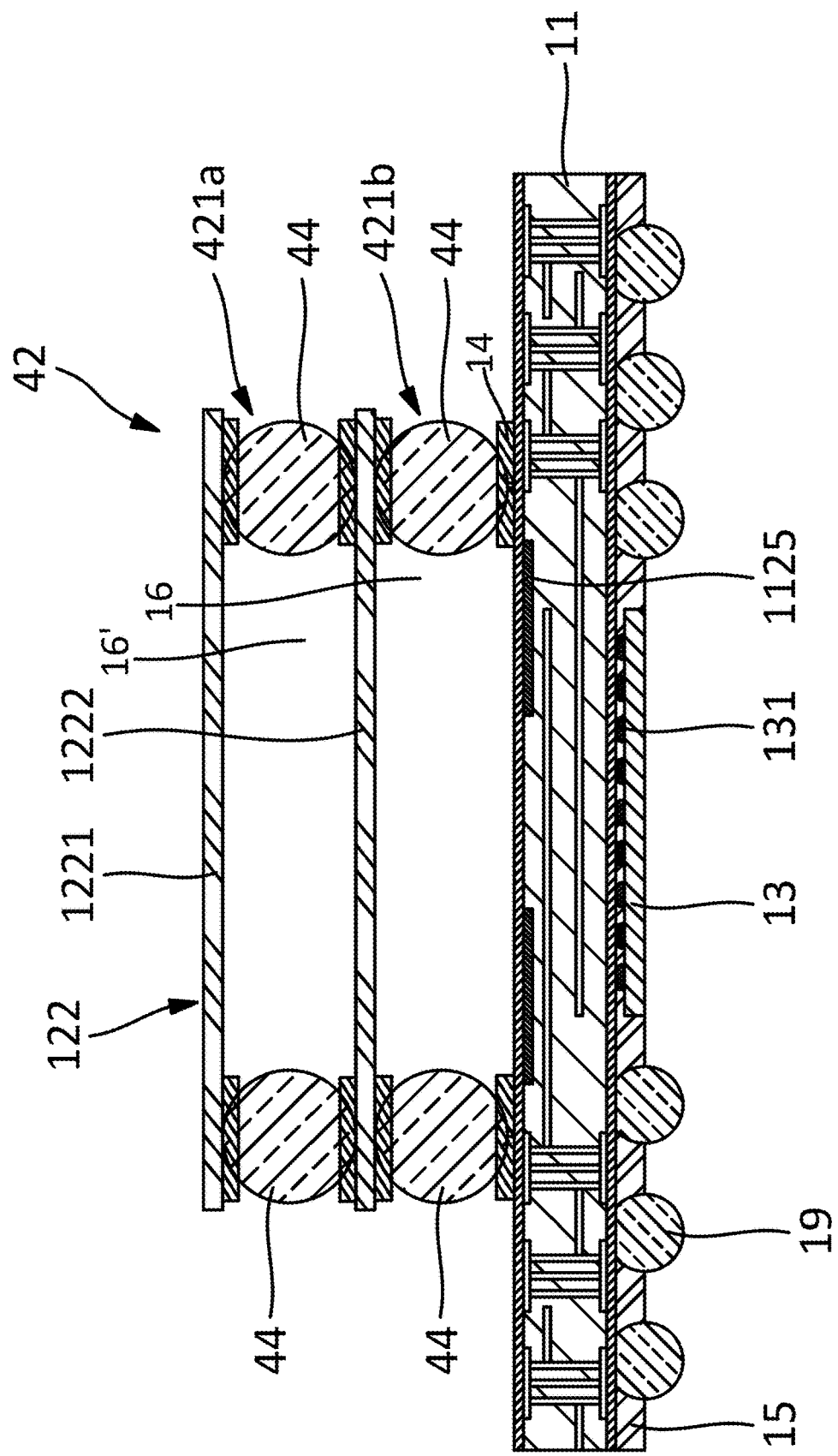
FIG. 5 shows a cross-sectional view of an example electronic device.

FIG. 5 shows a cross-sectional view of an example electronic device 40. In the example shown in FIG. 5, electronic device 40 can be similar to electronic device 10 described above and comprises antenna structure 42. Features, elements, or aspects of antenna structure 42 can be similar to those described with respect to antenna structure 12 or other antenna structures described herein. Antenna structure 42 can comprise dielectric structures 421a and 421b, and antenna elements 1221 and 1222. In some examples, each of dielectric structures 421a and 421b can comprise standoff 44. Each standoff 44 can comprise or be referred to as a sphere or column. In some examples, each standoff 44 can have a substantially circular cross-sectional shape. In some examples, dielectric structure 421b can be fixed on substrate 11 through bond 14, and dielectric structure 421a can be fixed on dielectric structure 421b or antenna element 1222. Antenna element 1222 can be supported by dielectric structure 421b, and antenna element 1221 can be supported by dielectric structure 421a. Air cavity 16 can be defined between antenna element 1222 and substrate 11, and air cavity 16' can be defined between antenna element 1221 and antenna element 1222.

Figure 6:
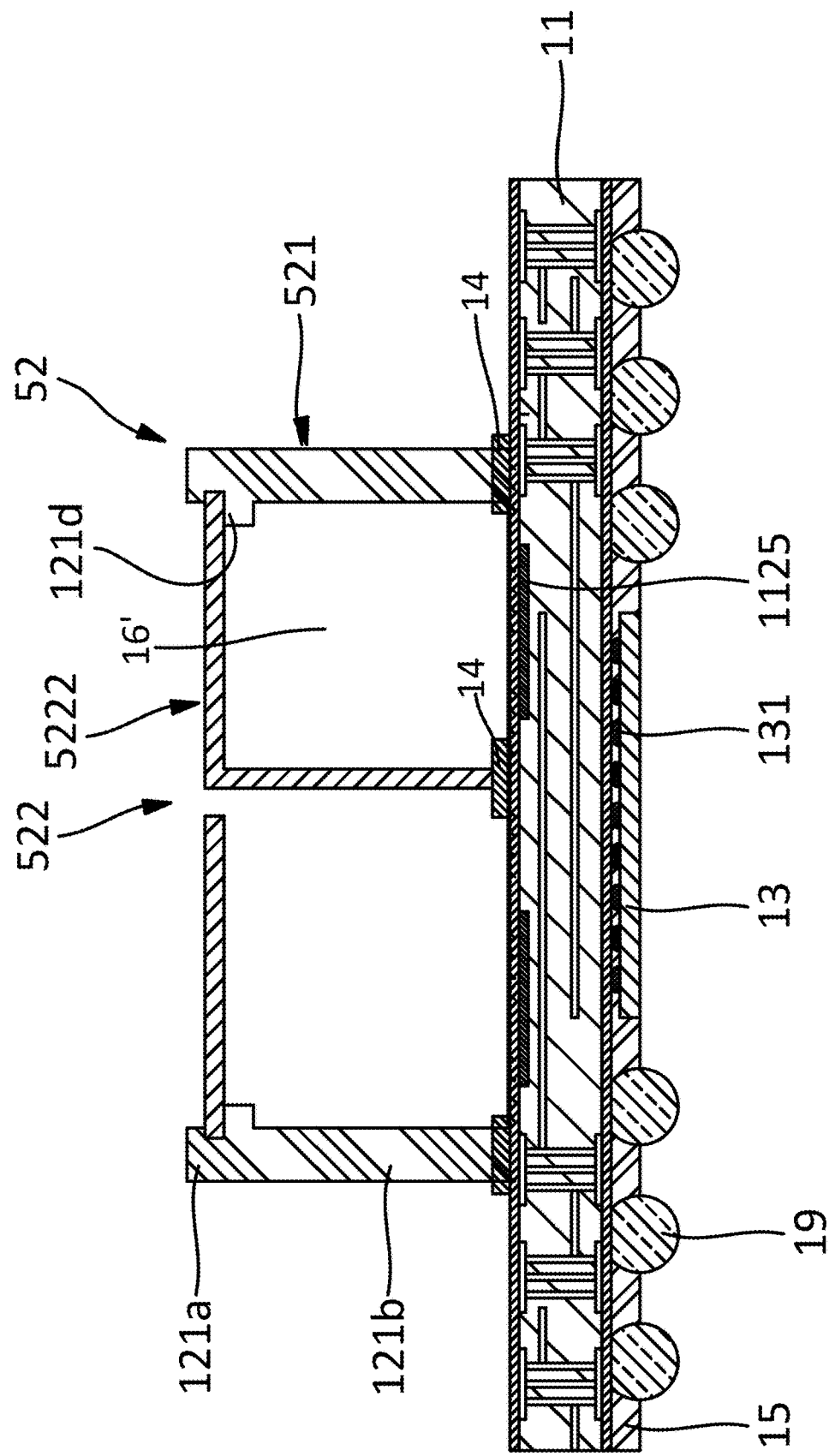
FIG. 6 shows a cross-sectional view of an example electronic device.

FIG. 6 shows a cross-sectional view of an example electronic device 50. In the example shown in FIG. 6, electronic device 50 can be similar to electronic device 10 and comprises for antenna structure 52. Features, elements, or aspects of antenna structure 52 can be similar to those described with respect to antenna structure 12 or other antenna structures described herein. Antenna structure 52 can comprise dielectric structure 521 and conductive structure 522. In some examples, conductive structure 522 can comprise antenna element 5222. In some examples, arbitrary antenna element 5222 can have a flat plate shape and can be coupled to and fixed to ledge 121d of dielectric structure 521. In some examples, antenna element 5222 can comprise an inverse L-shaped structure, with a first end coupled to ledge 121d of dielectric structure 521 and a second end coupled to substrate 11. In some examples, the second end of antenna element 5222 can be electrically coupled to substrate 11 through bond 14. In some examples, antenna element 5222 can comprise or be referred to as a transmitter, patch antenna, or dipole antenna.

Figure 7:
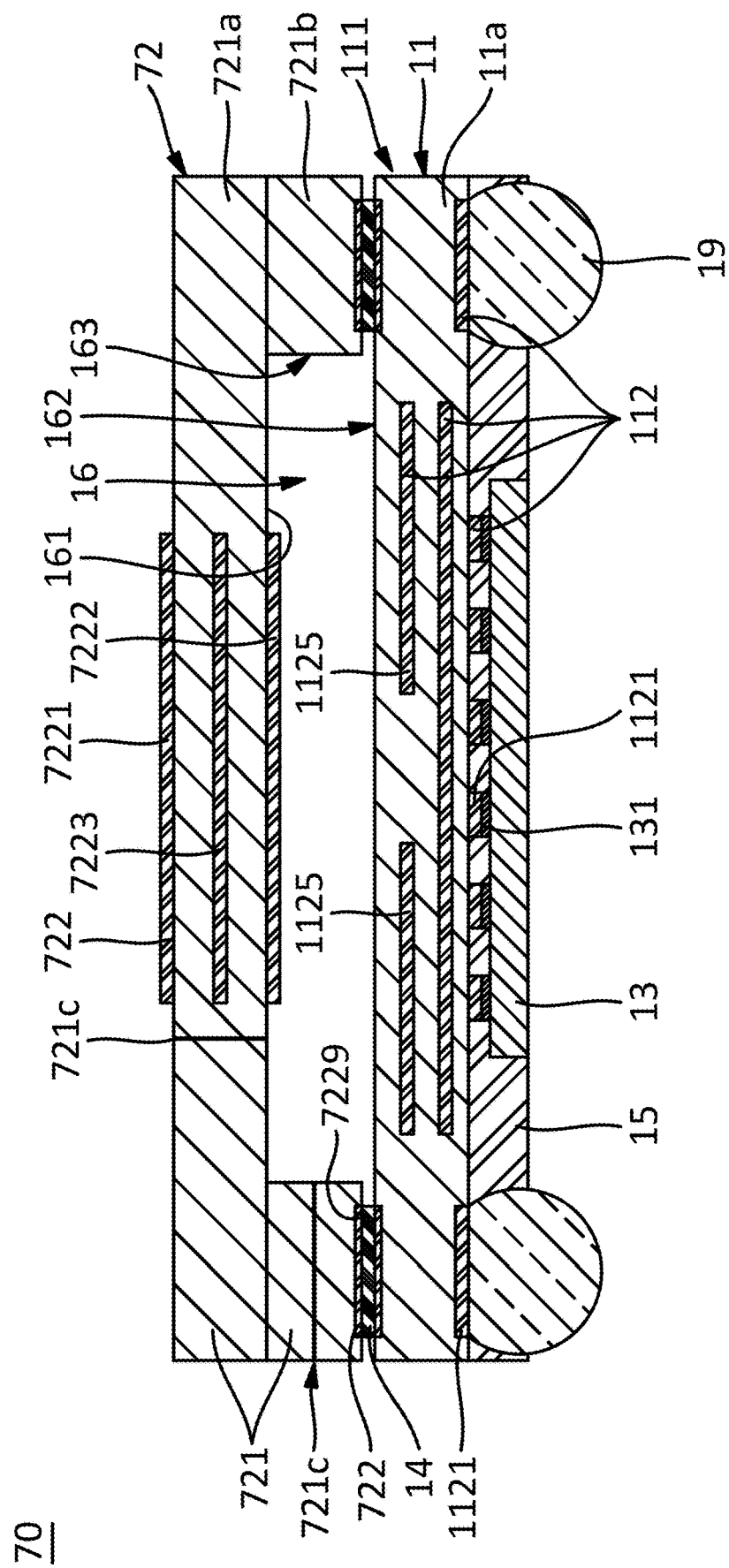
FIG. 7 shows a cross-sectional view of an example electronic device.

FIG. 7 shows a cross-sectional view of an example electronic device 70. In the example shown in FIG. 7, electronic device 70 can be similar to electronic device 10 described above and comprises antenna structure 72. Antenna structure 72 can comprise or be referred to as a transceiver structure, substrate, cavity substrate, laminate substrate, or RDL substrate. Features, elements, or aspects of antenna structure 72 can be similar to those described with respect to antenna structure 12 or other antenna structures described herein. In some examples, the structure and manufacture of antenna structure 72 can be similar to those of substrate 11.

Antenna structure 72 can comprise dielectric structure 721 and conductive structure 722. Dielectric structure 721 can comprise body 721a positioned spaced apart from substrate 11 and foot 721b fixed to substrate 11 through bond 14. In some examples, dielectric structure 721 can comprise vent 721c provided at body 721a or foot 721b. Dielectric structure 721 can comprise or be referred to as a cavity substrate. Body 721a can comprise or be referred to as a laminate substrate, an RDL substrate, or a molded substrate. Foot 721b coupled to body 721a can comprise or be referred to as a laminate substrate or a molded substrate. Conductive structure 722 can comprise one or more of antenna elements 7221, 7222, 7223, or conductor 7229. Antenna elements 7221, 7222, 7223 can be respectively provided on the top side of body 721a, on the bottom side of body 721a, or inside body 721a. In some examples, conductor 7229 can be electrically coupled to one or more of antenna elements 7221, 7222, 7223, or to conductive structure 112 of substrate 11. In some examples, antenna elements 7221, 7222, 7223 can be similar to antenna elements 1221, 1222, or can comprise or be referred to as a transmitter, an antenna, or a conductive pattern. Antenna elements 7221, 7222, 7223 can transmit or receive an RF signal to or from transceiver pattern 1125 of substrate 11. Air cavity 16 can be defined between substrate 11 and antenna elements 7221, 7222, 7223 or body 721a of dielectric structure 721.

Figure 8:
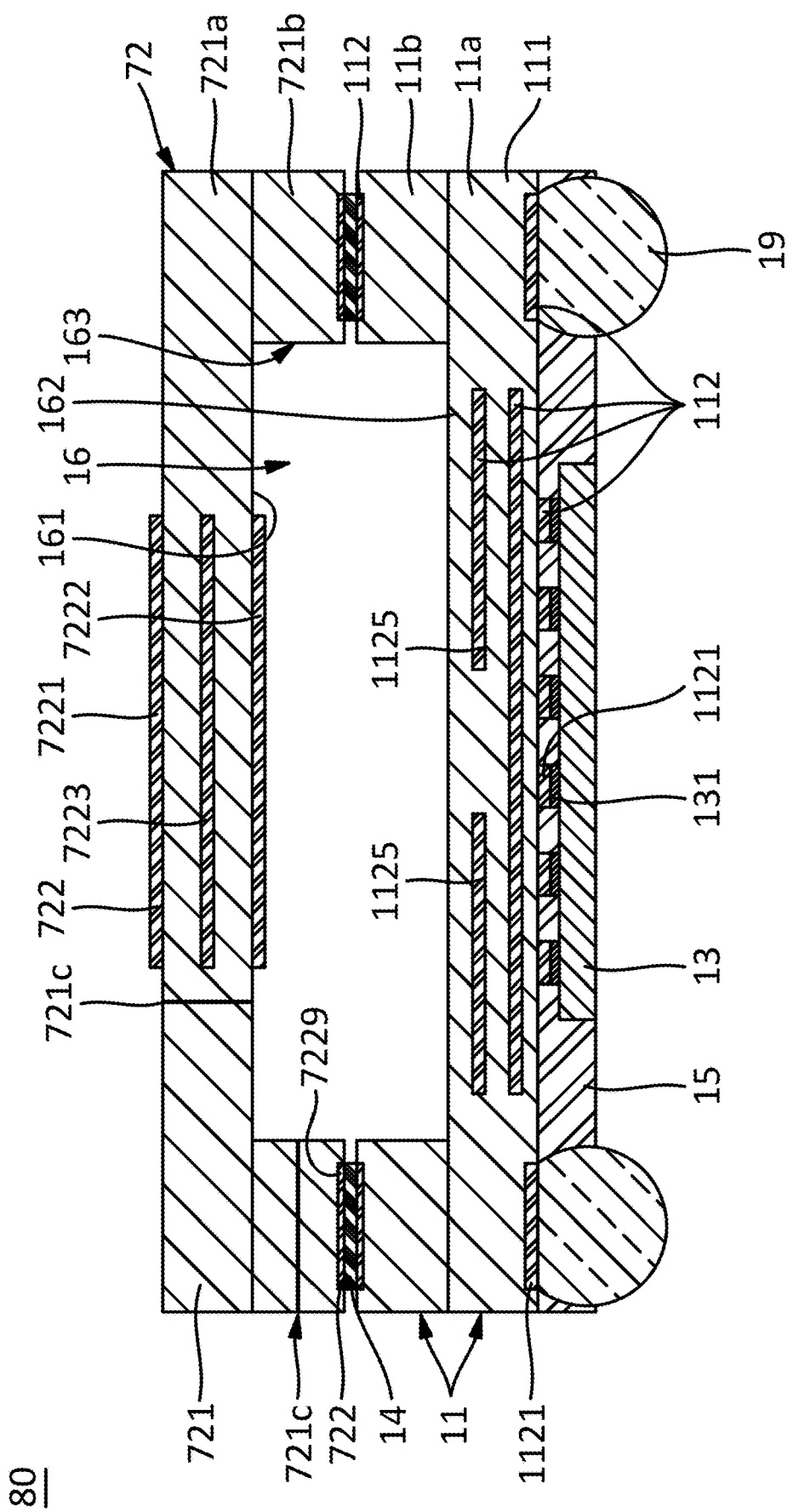
FIG. 8 shows a cross-sectional view of an example electronic device.

FIG. 8 shows a cross-sectional view of an example electronic device 80. In the example shown in FIG. 8, electronic device 80 can be similar to electronic device 70 described above, and substrate 11 can comprise or be referred to as a cavity substrate. In some examples, substrate 11 can comprise base 11a and wall 11b extending upwardly from the perimeter of base 11a. In some examples, foot 721b of antenna structure 72 can be fixed to wall 11b of substrate 11 through bond 14.

Figure 9:
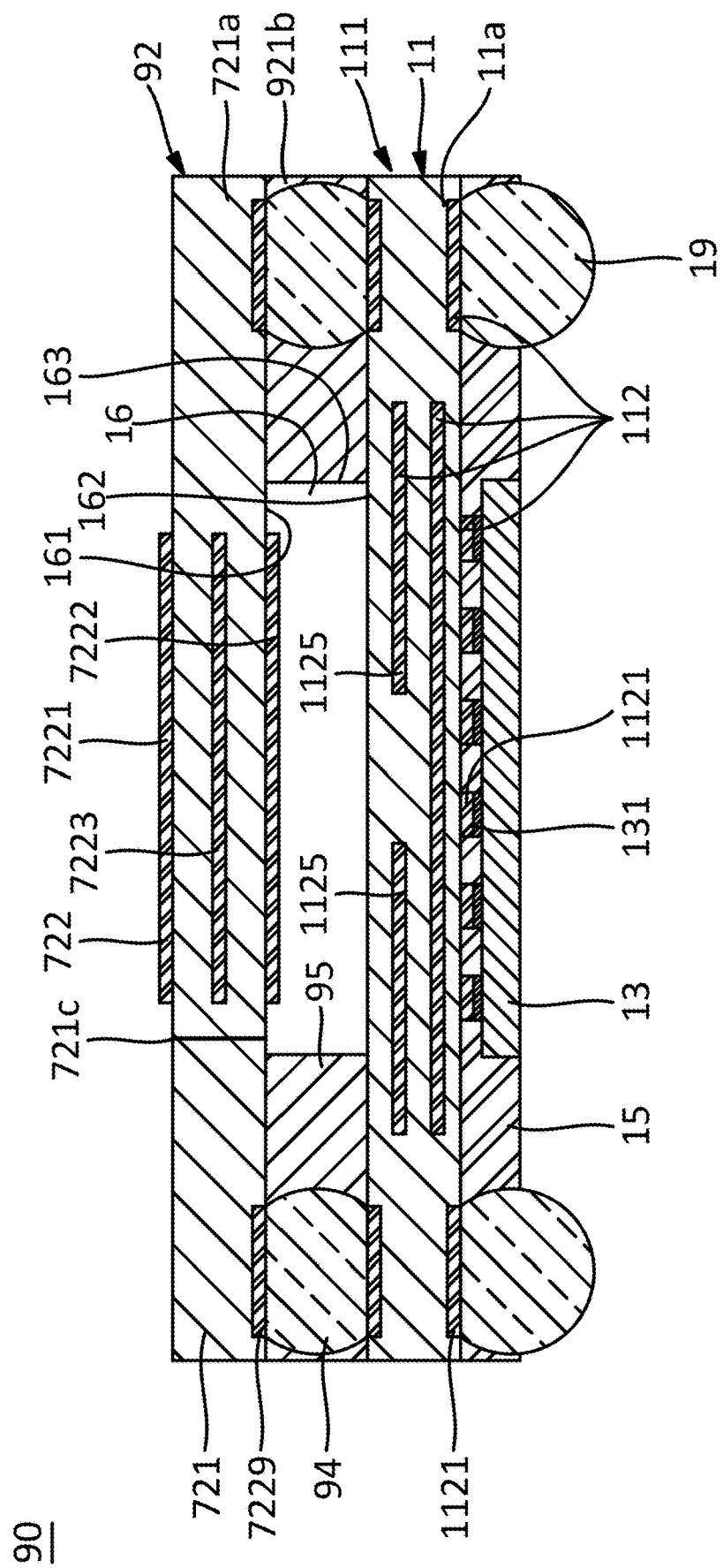
FIG. 9 shows a cross-sectional view of an example electronic device.

FIG. 9 shows a cross-sectional view of an example electronic device 90. In the example shown in FIG. 9, electronic device 90 can be similar to electronic device 70 described above and comprises antenna structure 92. Features, elements, or aspects of antenna structure 92 can be similar to those described with respect to antenna structure 12, 72, or other antenna structures described herein. Antenna structure 92 can comprise body 721a, conductive structure 722, and foot 921b. Foot 921b can comprise one or more of bond 94 or encapsulant 95. In some examples, encapsulant 95 can comprise a molded structure, a mold compound, a resin, a polymer, a resin having a filler, or a polymer having a filler. Conductive structure 722 can comprise antenna elements 7221, 7222, 7223 or conductors 7229 provided in body 721a.

Foot 921b can couple dielectric structure 721 to substrate 11. Foot 921b can comprise bond 94 and encapsulant 95. Bond 94 can be similar to bond 14 described above but can extend from substrate 11 to body 721a through foot 921b. Encapsulant 95 can comprise a mold compound or a polymer. In some examples, at least one of bond 94 or encapsulant 95 can be optional. Air cavity 16 can be defined between substrate 11 and antenna elements 7221, 7222, 7223 or body 721a of dielectric structure 721.

Figure 10A:
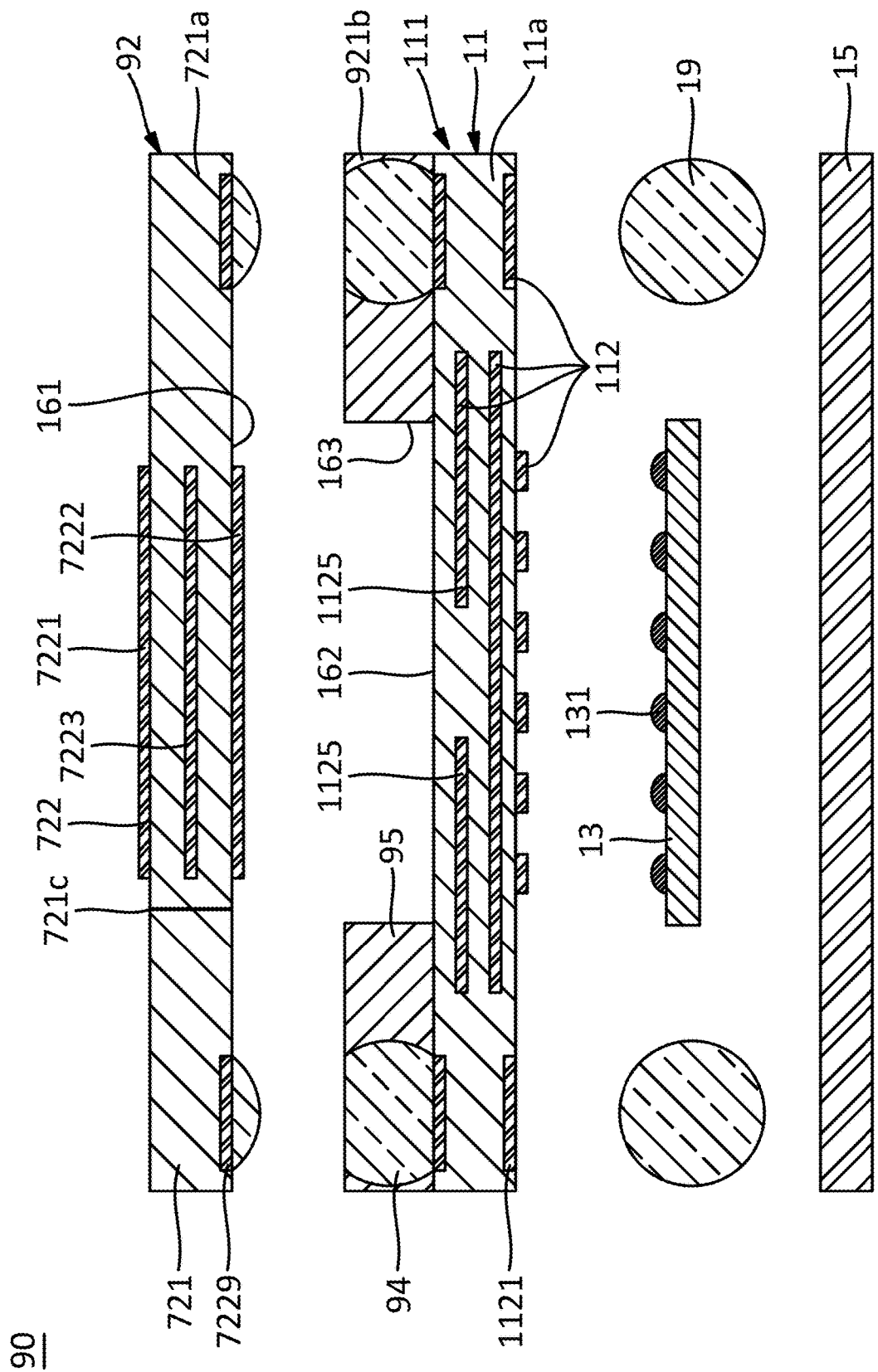
FIGS. 10A, 10B, and 10C show cross-sectional views of an example method for manufacturing an example electronic device.
Figure 10B:
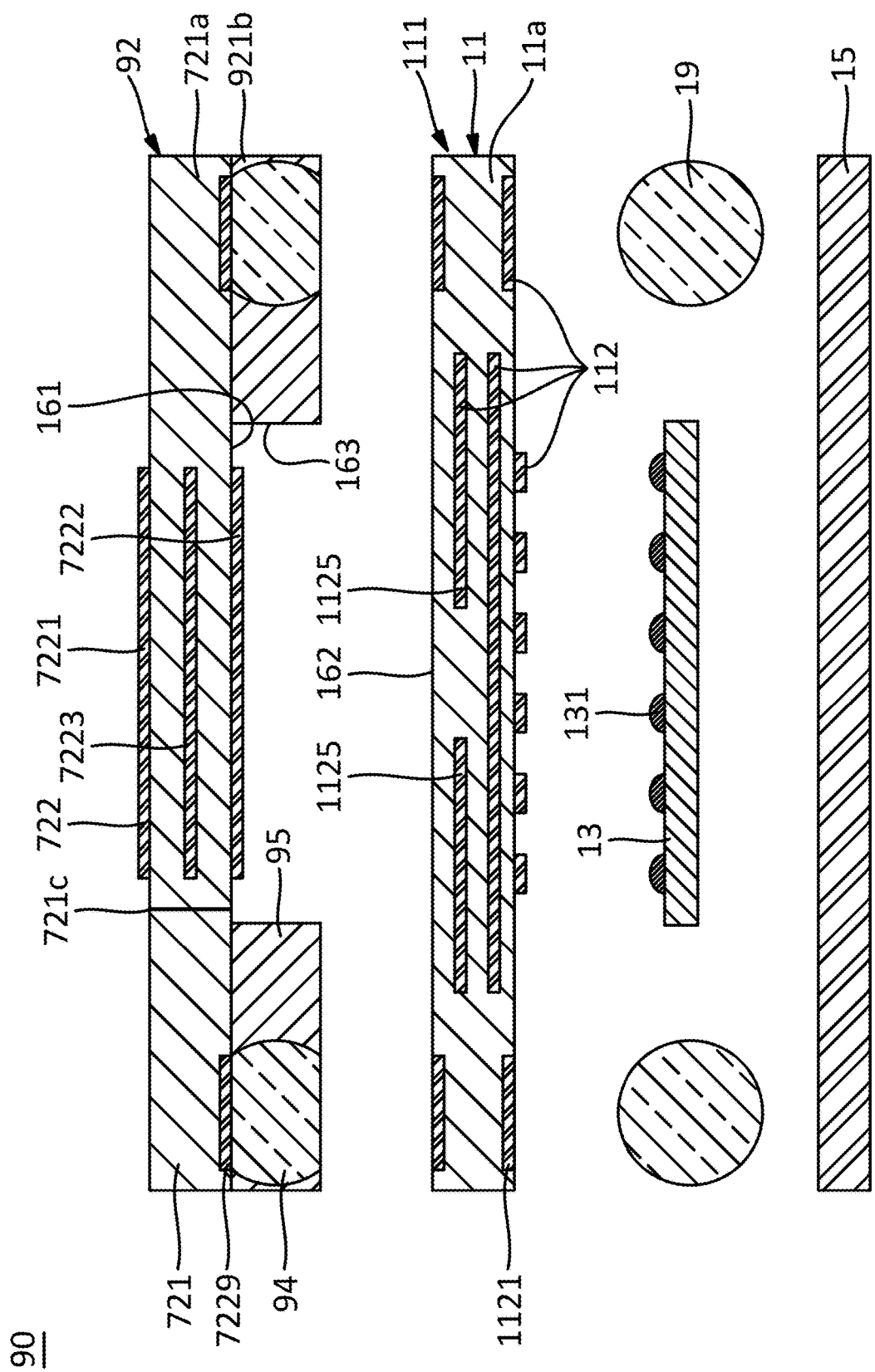
Figure 10C:
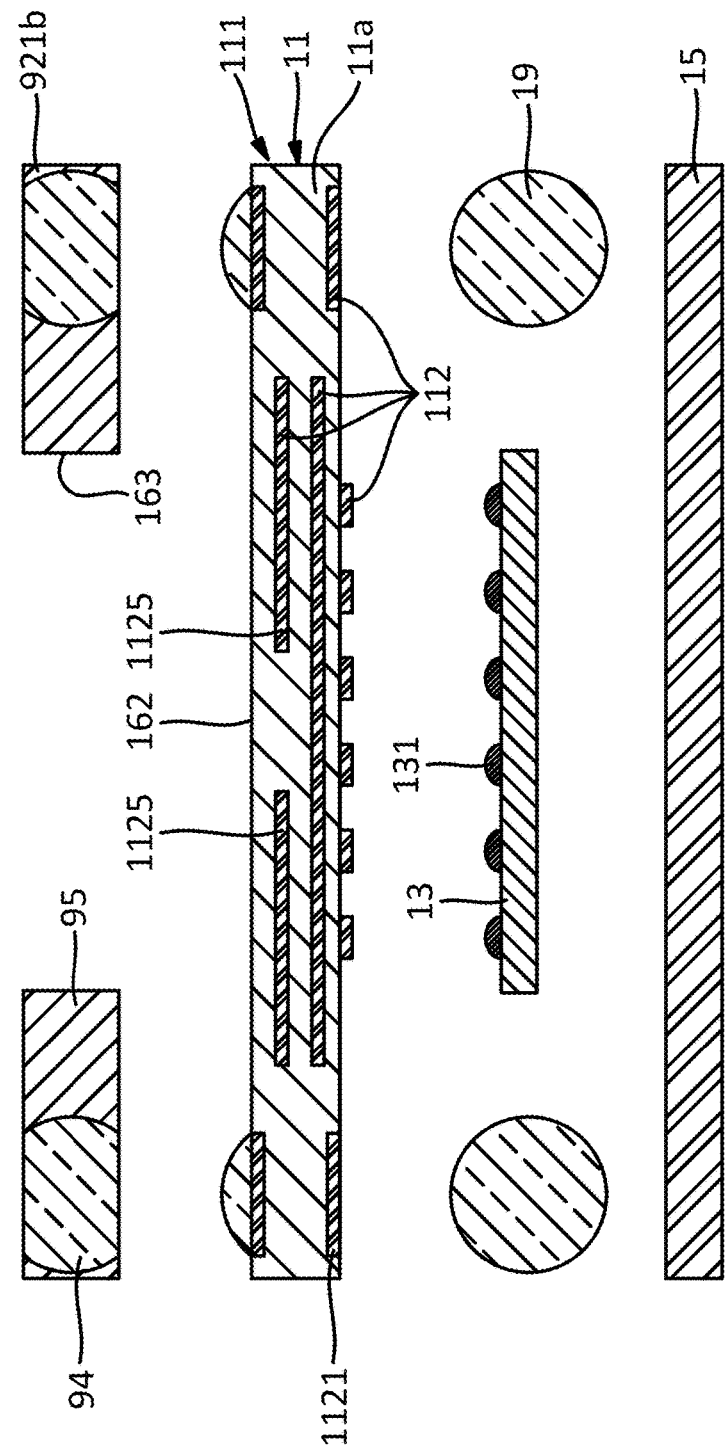

FIGS. 10A, 10B, and 10C show cross-sectional views of example methods for manufacturing electronic device 90 of FIG. 9. In the example shown in FIG. 10A, foot 921b can be a part of substrate 11 or can be initially provided on substrate 11. In the example shown in FIG. 10B, foot 921b can be a part of antenna structure 92 or can be initially provided on antenna structure 92. In the example shown in FIG. 10C, foot 921b can be a separate structure and can be coupled to substrate 11 or antenna structure 92.

As such, the present disclosure can provide a novel electronic device having an air pocket (cavity) under an antenna pattern usable, for example, for ultrahigh frequencies (>120 GHhz, 6G). The present disclosure can provide an electronic device having high antenna efficiency, such as impedance matching or radiation performance. The present disclosure can provide an electronic device capable of easily controlling the depth of an air cavity while overcoming the limitation of substrate manufacturing.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claimed is:

1. A method of manufacturing an electronic device, comprising:
   providing a substrate having a substrate top side, a substrate bottom side, a first dielectric structure, and a first conductive structure, wherein:
      the first conductive structure includes a transceiver pattern proximate to the substrate top side;
   providing an antenna structure comprising:
      a second dielectric structure coupled to the substrate top side;
      a second conductive structure comprising a first antenna element, the first antenna element comprising:
         a first antenna top side;
         a first antenna bottom side; and
         a first antenna lateral side connecting the first antenna top side to the first antenna bottom side; and
      a first cavity below the first antenna element;
   wherein:
      the first antenna lateral side comprises a planar surface so that the first antenna element has a substantially uniform width in a cross-sectional view;
      the first antenna element overlies the transceiver pattern;
      the first cavity comprises a first cavity ceiling, a first cavity base, and a first cavity sidewall between the first cavity ceiling and the first cavity base; and
      the first antenna bottom side defines the first cavity ceiling and a perimeter portion of the first antenna element including a part of the first antenna top side, a part of the first antenna bottom side, and the first antenna lateral side is fixed to and covered by the second dielectric structure; and
   providing an electronic component coupled to the substrate bottom side and coupled to the transceiver pattern.

2. The method of claim 1, further comprising:
   providing a conductor comprising a first end and a second end opposite to the first end;
   wherein:
      the first end of the conductor is coupled to the first antenna element; and
      the second end of the conductor is interposed between the substrate top side and the second dielectric structure.

3. The method of claim 1, wherein providing the antenna structure comprises:
   providing the second dielectric structure comprising a molded structure including:
      a body portion comprising a body portion top side and a body portion bottom side opposite to the body portion top side; and
      a foot portion comprising a foot portion top side and a foot portion bottom side opposite to the foot portion top side;
   wherein:
      the body portion bottom side is molded to the foot portion top side;
      the foot portion bottom side fixed to the substrate top side; and
      the first antenna element is molded within the molded structure between the body portion bottom side and the foot portion top side.

4. The method of claim 1, wherein providing the antenna structure comprises:
   providing the second dielectric structure comprising dielectric segments comprising:
      a first dielectric segment located proximate to a first outer edge of the substrate and comprising a first ledge facing a first direction;
      a second dielectric segment located proximate to a central portion of the substrate and comprises a second ledge facing a second direction perpendicular to the first direction so that the first antenna element extends through the second ledge; and
      ledges in the first dielectric segment and the second dielectric segment; and
   providing the perimeter portion of the first antenna element fixed to the ledges.

5. The method of claim 1, wherein providing the antenna structure comprises:
   providing a second cavity;
   providing the second conductive structure comprising a second antenna element separated from the first antenna element by the second cavity and comprising:
      a second antenna top side;
      a second antenna bottom side; and
      a second antenna lateral side connecting the second antenna top side to the second antenna bottom side; and
   providing the second dielectric structure comprises providing a part of the second antenna top side, a part of the second antenna bottom side; and the second antenna lateral side embedded within the second dielectric structure.

6. The method of claim 5, wherein providing the second dielectric structure comprises:
   providing a first molded portion with the first antenna element, the first molded portion comprising an alignment protrusion comprising an outer wall; and providing a second molded portion with the second antenna element, a portion of the second molded portion overlapping the outer wall.

7. The method of claim 1, wherein providing the antenna structure comprises:
providing the perimeter portion of the first antenna element fixed at a first end to the second dielectric structure; and
providing a second end of the first antenna element coupled to the substrate.

8. The method of claim 1, wherein providing the antenna structure comprises:
providing a vent in the second dielectric structure.

9. The method of claim 1, further comprising:
providing an encapsulant covering the substrate bottom side and at least portions of the electronic component;
wherein:
the electronic component comprises a component top side coupled to the substrate bottom side and a component bottom side opposite to the component top side; and
the component bottom side is exposed from the encapsulant.

10. The method of claim 1, wherein providing the antenna structure comprises:
providing the first cavity comprising an air cavity.

11. The method of claim 1, wherein providing the antenna structure comprises:
providing the first antenna element comprising a continuous structure without openings or breaks.

12. A method of manufacturing an electronic device, comprising:
providing a substrate having a substrate top side, a substrate bottom side, a first dielectric structure, and a first conductive structure, wherein:
the first conductive structure includes a transceiver pattern embedded within the first dielectric structure and spaced apart from the substrate top side and the substrate bottom side;
providing an antenna structure comprising:
a second dielectric structure coupled to the substrate top side and comprising a body that overlies the transceiver pattern;
a second conductive structure comprising a first antenna element overlying the transceiver pattern and completely embedded inside of the second dielectric structure so that all outer surfaces of the first antenna element are covered by the second dielectric structure, the first antenna element comprising:
a first antenna top side;
a first antenna bottom side; and
a first antenna lateral side connecting the first antenna top side to the first antenna bottom side; and
a first cavity below the first antenna element and comprising a first cavity ceiling defined by a bottom surface of the body, a first cavity base, and a first cavity sidewall between the first cavity ceiling and the first cavity base; and
providing an electronic component coupled to the substrate bottom side and coupled to the transceiver pattern.

13. The method of claim 12, further comprising:
providing a wall extending upward from the substrate top side;
wherein:
providing the antenna structure comprises providing the second dielectric structure comprising a foot coupled to the body and fixed to wall with a bond; and
the foot is fixed to the wall with a bond.

14. The method of claim 12, wherein providing the antenna structure comprises:
providing a foot coupled to the body and the substrate top side;
wherein:
an encapsulant and a conductive bond extending from the substrate top side to the bottom surface of the body the encapsulant covers opposing lateral sides of the conductive bond in a cross-sectional view;
the encapsulant comprises an encapsulant top side;
the conductive bond comprises a bond top side; and
the bond top side is coplanar with the encapsulant top side.

15. The method of claim 12, further comprising:
providing an encapsulant covering the substrate bottom side and at least portions of the electronic component;
wherein:
the electronic component comprises a component top side coupled to the substrate bottom side and a component bottom side opposite to the component top side; and
the component bottom side is exposed from the encapsulant.

16. The method of claim 15, further comprising:
providing external interconnects coupled to the substrate bottom side;
wherein:
providing the encapsulant comprises providing the encapsulant covering first portions of the external interconnects providing second portions of the external interconnects exposed from the encapsulant.

17. The method of claim 12, wherein providing the antenna structure comprises:
providing a foot coupled to the body and the substrate top side.

18. The method of claim 17, wherein providing the foot comprises:
providing a vent extending through foot.

19. A method of forming an electronic device, comprising:
providing a substrate having a substrate top side, a substrate bottom side, a first dielectric structure, and a first conductive structure, wherein:
the first conductive structure includes a transceiver pattern proximate to the substrate top side;
providing an antenna structure comprising:
a second dielectric structure coupled to the substrate top side;
a second conductive structure comprising a first antenna element, the first antenna element comprising:
a first antenna top side;
a first antenna bottom side; and
a first antenna lateral side connecting the first antenna top side to the first antenna bottom side; and
a first cavity below the first antenna element;
wherein:
at least a portion of the first antenna element is exposed outside of the electronic device;
the first antenna element overlies the transceiver pattern; and the first cavity comprises a first cavity ceiling, a first cavity base, and a first cavity sidewall between the first cavity ceiling and the first cavity base; and providing an electronic component coupled to the substrate bottom side and coupled to the transceiver pattern, wherein:

the second dielectric structure comprises a first foot and a first ceiling bent inward from an upper end of the first foot;

the first foot is attached to the substrate top side;

the first ceiling of the second dielectric structure comprises a first ceiling top side and a first ceiling bottom side opposite to the first ceiling top side;

a perimeter portion of the first antenna element is fixed to the first ceiling top side of the second dielectric structure;

the first ceiling bottom side of the second dielectric structure and a portion of the first antenna bottom side define the first cavity ceiling.

20. The method of claim 19, further comprising:
providing a third dielectric structure; and
providing a second antenna element;
wherein:

the third dielectric structure comprises a second foot including an upper end and a second ceiling bent inward from the upper end;

a perimeter portion of the second antenna element is fixed to the second ceiling;

the second foot is attached to the substrate top side and laterally spaced apart from the first foot;

the third dielectric structure and the second antenna element enclose the second dielectric structure and the first antenna element so that the third dielectric structure, the second antenna element, the second dielectric structure, the first antenna element, and the substrate top side define a second cavity; and the second cavity extends horizontally over the first ceiling top side and extends vertically between the first foot and the second foot.

* * * * *